US012641981B2

(12) United States Patent
Huang et al.

(10) Patent No.: US 12,641,981 B2
(45) Date of Patent: May 26, 2026

(54) DISPLAY PANEL AND DISPLAY DEVICE WITH SIGNAL LINES HAVING BYPASS PORTIONS IN FRAME AREA AND DISPLAY AREA

(71) Applicant: Shanghai Tianma Micro-Electronics Co., Ltd., Shanghai (CN)

(72) Inventors: Gaojun Huang, Shanghai (CN); Zhongjie Zhang, Shanghai (CN); Yi Liu, Shanghai (CN); Chunmei Gao, Shanghai (CN); Qibing Wei, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 707 days.

(21) Appl. No.: 18/145,725

(22) Filed: Dec. 22, 2022

(65) Prior Publication Data

US 2023/0129729 A1     Apr. 27, 2023

(30) Foreign Application Priority Data

Sep. 6, 2022    (CN) .......................... 202211086286.0

(51) Int. Cl.
*H10K 59/65*        (2023.01)
*H10K 59/131*       (2023.01)

(52) U.S. Cl.
CPC ........... *H10K 59/65* (2023.02); *H10K 59/131* (2023.02)

(58) Field of Classification Search
CPC .............................. H10K 59/65; H10K 59/131
See application file for complete search history.

(56) References Cited

U.S. PATENT DOCUMENTS

| | | | | |
|---|---|---|---|---|
| 9,853,096 | B1* | 12/2017 | Choi | H10K 59/131 |
| 2016/0019856 | A1* | 1/2016 | Tanaka | G09G 3/3666 |
| | | | | 345/206 |
| 2019/0051670 | A1* | 2/2019 | Bei | H10D 86/60 |
| 2019/0123066 | A1* | 4/2019 | Zhan | H10D 86/411 |
| 2019/0285954 | A1* | 9/2019 | Yoshida | G06F 3/04164 |
| 2020/0064702 | A1* | 2/2020 | Yeh | G02F 1/136286 |
| 2020/0175918 | A1* | 6/2020 | An | G09G 3/3233 |

(Continued)

OTHER PUBLICATIONS

Office Action mailed Dec. 24, 2025, issued in corresponding Chinese Patent Application No. 202211086286.0, filed Sep. 6, 2022, 13 pages.

*Primary Examiner* — Lex H Malsawma
(74) *Attorney, Agent, or Firm* — CHRISTENSEN O'CONNOR JOHNSON KINDNESS PLLC

(57) ABSTRACT

A display panel and a display device are provided. A first optical component area has a first width along a first direction greater than a second width along a second direction, and a display area includes a first display area and a second display area located at two sides of the first optical component area along the second direction. The display panel includes first signal lines, which include first-type signal lines and second-type signal lines and each include a first portion arranged in the first display area and a second portion arranged in the second display area. A first bypass portion connecting the first portion and the second portion of the first-type signal line is arranged in the display area. A second bypass portion connecting the first portion and the second portion of the second-type signal line is arranged in the first frame area.

19 Claims, 19 Drawing Sheets

(56) References Cited

U.S. PATENT DOCUMENTS

| | | | | |
|---|---|---|---|---|
| 2020/0227505 A1* | 7/2020 | Kim | ........................ | H10K 59/80 |
| 2021/0134937 A1* | 5/2021 | Choi | ..................... | H10K 59/131 |
| 2021/0167160 A1* | 6/2021 | Um | ........................ | H10K 77/10 |
| 2021/0193772 A1* | 6/2021 | Han | ..................... | H10K 59/131 |
| 2022/0005886 A1* | 1/2022 | Jeong | ..................... | H10K 59/88 |

* cited by examiner

DISPLAY PANEL AND DISPLAY DEVICE WITH SIGNAL LINES HAVING BYPASS PORTIONS IN FRAME AREA AND DISPLAY AREA

CROSS-REFERENCE TO RELATED APPLICATIONS

The present application claims priority to Chinese Patent Application No. 202211086286.0 filed on Sep. 6, 2022, the content of which is incorporated herein by reference in its entirety.

TECHNICAL FIELD

The present disclosure relates to the field of display technology, and in particular, to a display panel and a display device.

BACKGROUND

With the diversification of display panels, there has been a design in which a through hole is formed in a display area of the display panel to arrange a component such as a camera. However, the through hole formed in the display area will cut off part of signal lines, therefore, how to configure the signal lines corresponding to at least two through holes has become the focus of researchers, when the through holes formed in the display area are relatively wide. Accordingly, display panels with through holes that do not cut off signal lines are needed.

SUMMARY

In view of this, embodiments of the present disclosure provide a display panel and a display device.

In one aspect, an embodiment of the present disclosure provides a display panel, including first signal lines. The display panel has a first optical component area and a display area. The first optical component area has a first width along a first direction greater than a second width along a second direction, where the first direction is perpendicular to the second direction. The first optical component area includes a first frame area and a first light-transmission area, and the first frame area surrounds the first light-transmission area. The display area at least partially surrounds the first optical component area and includes a first display area and a second display area. Along the second direction, the first display area and the second display area are located on two sides of the first optical component area. The first signal lines include first-type signal lines and second-type signal lines. The first-type signal lines and the second-type signal lines each include a first portion and a second portion, and the first portion is arranged in the first display area and the second portion is arranged in the second display area. The first-type signal lines each further include a first bypass portion connecting the first portion and the second portion, and the second-type signal lines each further include a second bypass portion connecting the first portion and the second portion. The first bypass portion is arranged in the display area, and the second bypass portion is arranged in the first frame area.

In a second aspect, an embodiment of the present disclosure provides a display device, including the display panel in the first aspect.

BRIEF DESCRIPTION OF DRAWINGS

In order to better illustrate technical solutions in embodiments of the present disclosure, the accompanying drawings used in the embodiments are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship In the description of this specification, it should be understood that the terms "substantially", "basically" "approximately", "about", "almost" and "roughly" described in the claims and embodiments of the present disclosure indicates a value that can be generally agreed within a reasonable process operation range or tolerance range, rather than an exact value.

It should be understood that, although the bypass portion, portion, sub-portion may be described using the terms of "first", "second", "third", etc., in the embodiments of the present disclosure, the bypass portion, portion, sub-portion will not be limited to these terms. These terms are merely used to distinguish bypass portions, portions, sub-portions from one another. For example, without departing from the scope of the embodiments of the present disclosure, a first bypass portion, portion, sub-portion may also be referred to as a second bypass portion, portion, sub-portion, similarly, a second bypass portion, portion, sub-portion may also be referred to as a first bypass portion, portion, sub-portion, etc.

Through careful and in-depth research, the Applicant of the present disclosure provides a technical solution to the problems existing in the related art.

Figure 1:
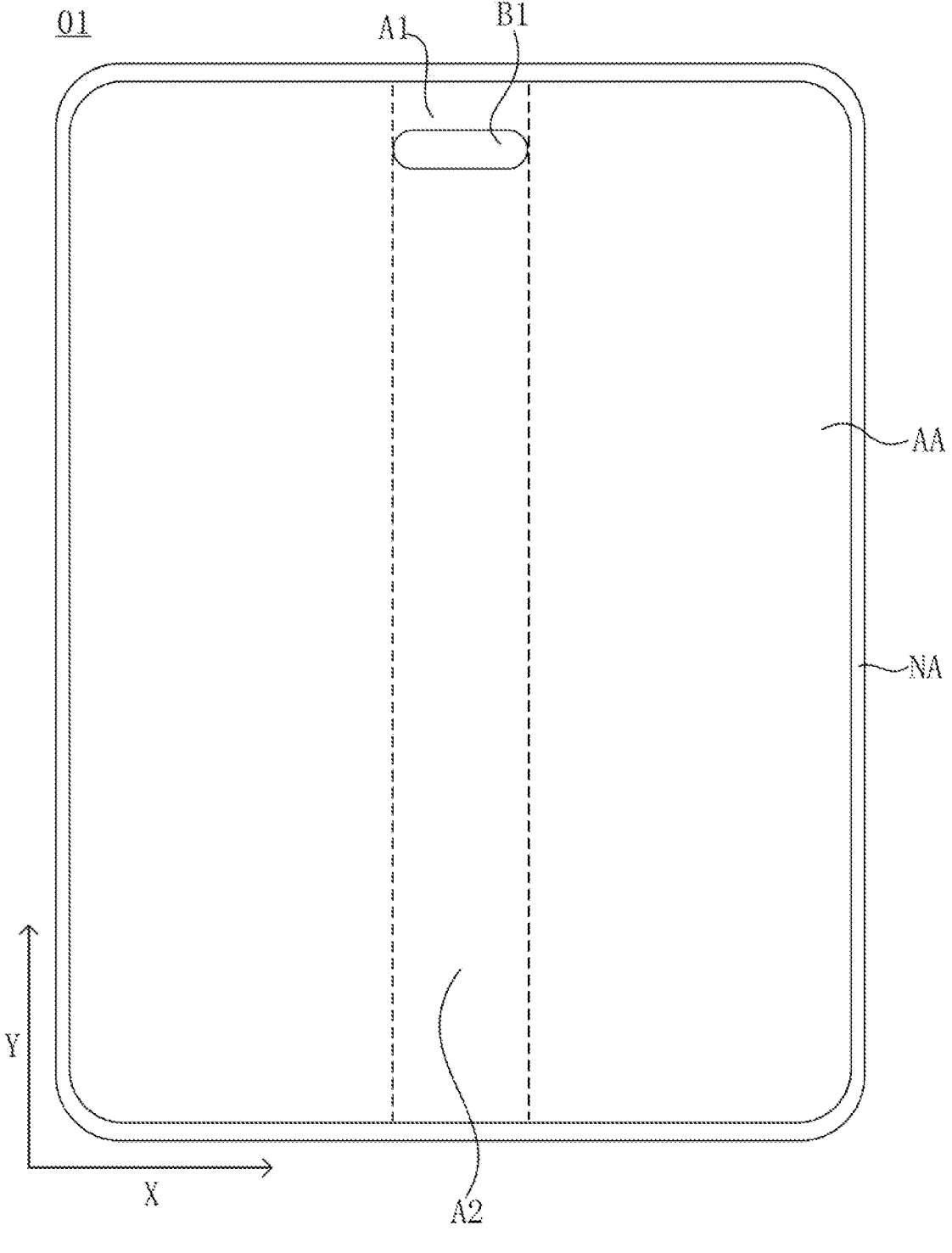
FIG. 1 is a schematic diagram of a display panel according to an embodiment of the present disclosure.

FIG. 1 is a schematic diagram of a display panel according to an embodiment of the present disclosure.

As shown in FIG. 1, an embodiment of the present disclosure provides a display panel 01, having a display area AA, a non-display area NA, and a first optical component area B1. The display area AA is an area of the display panel 01 that performs light-emitting display. The non-display area NA surrounds the display area AA and is an area of the display panel 01 where peripheral circuits and encapsulation are arranged. The first optical component area B1 is configured to arrange optical components. For example, the first optical component area B1 may be provided with an optical sensor, a camera, a human-face recognition sensor, a flashlight, and the like. In order to enable the optical components arranged in the first optical component area B1 to receive light from the outside or emit light to the outside, the transmittance of the first optical component area B1 to the light is greater than the transmittance of the display area AA to the light.

It should be noted that when an optical component in the first optical component area B1 can emit light to the outside, this optical component in the first optical component area in B1 is different from a sub-pixel in the display area AA. The first optical component area B1 is not provided with a sub-pixel, or the first optical component area B1 is provided with a sub-pixel but the first optical component area B1 is in a highly light-transmitting state.

Further, in the embodiments of the present disclosure, the first optical component area B1 may be configured in various manners. For example, the first optical component area B1 is provided with a through hole or a blind hole. The through hole penetrates through the display panel 01 along a thickness direction of the display panel 01 and may be formed by cutting the display panel 01. The blind hole does not penetrate through the display panel 01 along the thickness direction of the display panel 01 and may be formed by arranging no sub-pixels in the first optical component area B1.

A width of the first optical component area B1 along a first direction X is greater than a width of the first optical component area B1 along a second direction Y, and the first direction X is substantially perpendicular to the second direction Y. As shown in FIG. 1, the first direction X may be a row direction and the second direction Y may be a column direction, then, the width of the first optical component area B1 along the row direction is greater than the width of the first optical component area B1 along the column direction.

The display area AA at least partially surrounds the first optical component area B1, that is, at least part of a peripheral area of the first optical component area B1 is the display area AA. For example, as shown in FIG. 1, the display area AA completely surrounds the first optical component area B1. In some cases, the display area AA may partially surround the first optical component area B1.

With further reference to FIG. 1, the display area AA includes a first display area A1 and a second display area A2, and along the second direction Y, the first display area A1 and the second display area A2 are located at two sides of the first optical component area B1, respectively. It can be understood that the two areas of the display area AA that are located at two opposite sides of the first optical component area B1 and arranged along the second direction Y with the first optical component area B1 may be referred to as the first display area A1 and the second display area A2, respectively.

Figure 2:
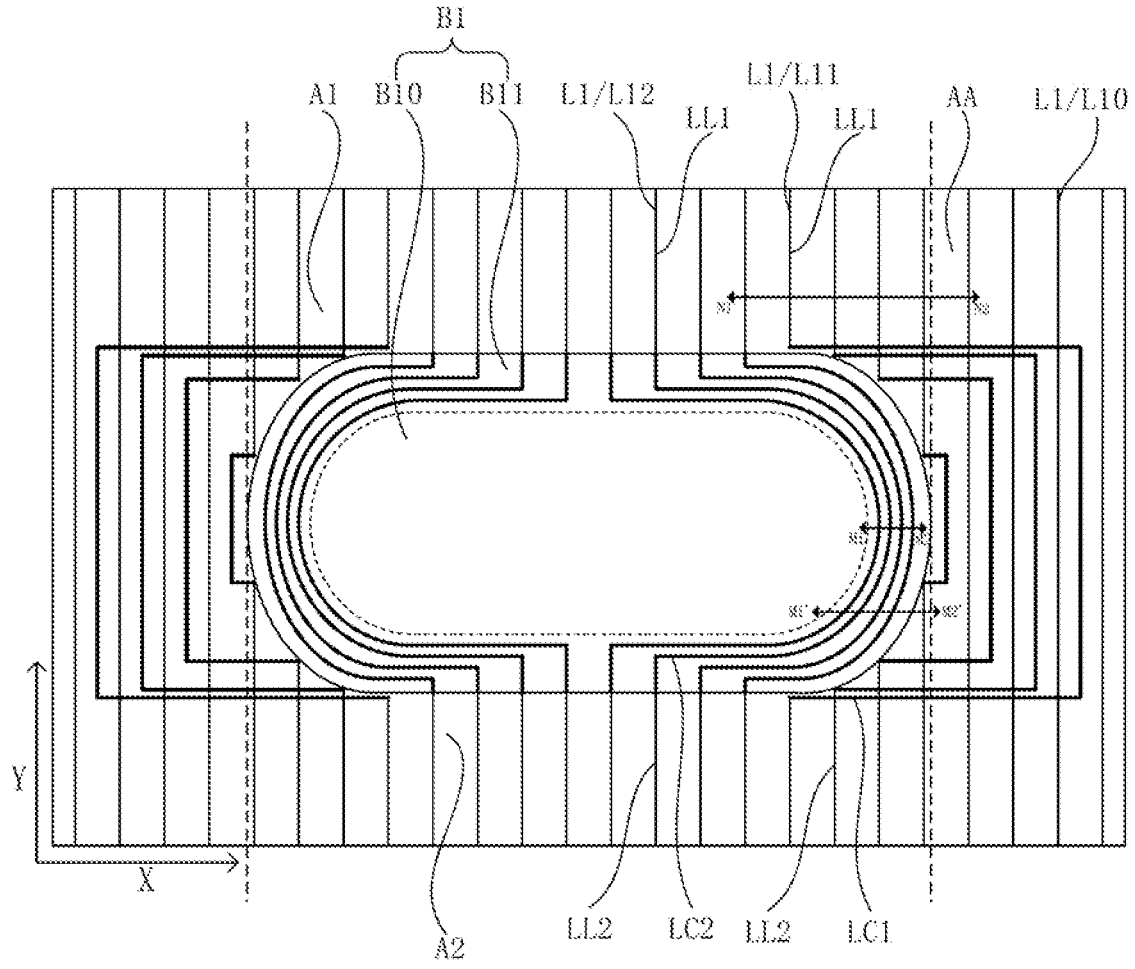
FIG. 2 is a partial schematic diagram of a display panel according to an embodiment of the present disclosure.

FIG. 2 is a partial schematic diagram of a display panel according to an embodiment of the present disclosure.

As shown in FIG. 2, the first optical component area B1 includes a first frame area B11 and a first light-transmission area B10, and the first frame area B11 surrounds the first light-transmission area B10. When the first optical component area B1 is provided with a through hole, the first light-transmission area B10 may correspond to the through hole in the first optical component area B1. When the first optical component area B1 is provided with a blind hole, the first light-transmission area B10 may correspond to the blind hole in the first optical component area B1.

In order to ensure the high light transmittance of the first light-transmission area B10, when a signal line extending along the first direction X in the display area AA passes the first optical component area B1, a bypass-line design is required to avoid the first light-transmission area B10; and when a signal line extending along the second direction Y in the display area AA passes the first optical component area B1, a bypass-line design is required to avoid the first light-transmission area B10. That is, the signal line corresponding to the first optical component area B1 is designed to avoid the first light-transmission area B10 when extending to the first optical component area B1. As shown in FIG. 2, multiple signal lines that are arranged along the second direction Y and at least partially overlap with the first optical component area B1 along the first direction X are provided with a bypass line to avoid the first light-transmission area B10, and multiple signal lines that are arranged along the first direction X and at least partially overlap with the first optical component area B1 along the second direction Y are provided with a bypass line to avoid the first light-transmission area B10.

As shown in FIG. 2, the bypass lines of some signal lines located at a periphery of the first light-transmission area B10 are arranged in the first frame area B11, then the first frame area B11 can be regarded as an area, for arranging the bypass lines, in the first optical component area B1. Further, when the first light-transmission area B10 corresponds to the through hole in the first optical component area B1, the first frame area B11 further includes an encapsulation area in the first optical component area B1. In addition to a traditional retaining wall, the encapsulation area herein may also be provided with an isolation column or a partition slot with a wide upper portion and a narrow lower portion, to isolate a cathode and an organic light-emitting layer, thereby preventing water/oxygen from invading the display area through the cathode or the organic light-emitting layer.

It should be noted that, as shown in FIG. 2, the first optical component area B1 may include two first light-transmission areas B10 arranged along the first direction X, that is, the first optical component area B1 may be provided with two optical components. In this case, the configuration that the first frame area B11 surrounds the first light-transmission area B10 can be illustrated as that, at least two first light-transmission areas B10 in the first optical component area B1 as a whole is surrounded by the first frame area B11.

In combination with FIG. 1 and FIG. 2, the display panel 01 further includes first signal lines L1. The first signal lines L1 may supply signals to sub-pixels in the display panel 01. For example, the first signal lines L1 may provide data voltage signals to the sub-pixels. Since the width of the first optical component area B1 in the first direction X is greater than the width of the first optical component area B1 in the second direction Y, the first signal lines L1 extending along the second direction Y and cut off by the first optical component area B1 are more than the first signal lines L1 extending along the first direction X and cut off by the first optical component area B1.

The first signal lines L1 include a first-type signal line L11 and a second-type signal line L12, and each of the first-type signal line L11 and the second-type signal line L12 includes a first portion LL1 and a second portion LL2. The first portion LL1 is arranged in the first display area A1, and the second portion LL2 is arranged in the second display area A2. That is, each of the first-type signal line L11 and the second-type signal line L12 includes a first portion LL1 extending in the first display area A1 and a second portion LL2 extending in the second display area A2. As shown in FIG. 1 and FIG. 2, for each of the first-type signal line L11 and the second-type signal line L12, since the first portion LL1 and the second portion LL2 are respectively arranged in the first display area A1 and the second display area A2 that are arranged in the second direction Y, the first-type signal line L11 substantially extends along the second direction Y and the second-type signal line L12 substantially extends along the second direction Y, and the first portion LL1 and the second portion LL2 may both extend along the second direction Y.

Each of the first signal lines L1 in the display panel 01 may substantially extend along the second direction Y.

In an embodiment of the present disclosure, as shown in FIG. 2, the first-type signal line L11 further includes a first bypass portion LC1 connecting the first portion LL1 and the second portion LL2, and the first bypass portion LC1 is arranged in the display area AA. That is, the first portion LL1 of the first-type signal line L11 arranged in the first display area A1 and the second portion LL2 of the first-type signal line L11 arranged in the second display area A2 are electrically connected to each other through the first bypass portion LC1, and at least part of the first bypass portion LC1 is arranged in display area AA. In this case, although the first-type signal line L11 includes a first portion LL1 extending in the first display area A1 and a second portion LL2 extending in the second display area A2, the first-type signal line L11 does not extend into the first light-transmission area B10 from the first display area A1 or the second display area A2, but has a bypass portion in the display area AA to avoid the first light-transmission area B10.

In an example, as shown in FIG. 2, the first bypass portion LC1 is arranged in the display area AA.

In an embodiment of the present disclosure, as shown in FIG. 2, the second-type signal line L12 further includes a second bypass portion LC2 connecting the first portion LL1 and the second portion LL2, and the second bypass portion LC2 is arranged in the first frame area B11. That is, the first portion LL1 of the second-type signal line L12 arranged in the first display area A1 and the second portion LL2 of the second-type signal line L12 arranged in the second display area A2 are electrically connected to each other through the second bypass portion LC2, and at least part of the second bypass portion LC2 is arranged in the first frame area B11. In this case, although the second-type signal line L12 includes a first portion LL1 extending in the first display area A1 and a second portion LL2 extending in the second display area A2, the second-type signal line L12 does not extend into the first light-transmission area B10 from the first display area A1 or the second display area A2, but has a bypass portion in the first frame area B11 to avoid the first optical component area B1.

In an example, as shown in FIG. 2, the second bypass portion LC2 is arranged in the first frame area B1.

In the embodiments of the present disclosure, some of the bypass portions of the first signal lines L1 corresponding to the first optical component area B1 are arranged in the display area AA, so these bypass portions can avoid the first frame area B11 of the first optical component area B1, thereby avoiding that the number of the first signal lines L1 whose bypass portions are arranged in the first frame area B11 is too large. In this way, the first frame area B11 has a smaller width, so that the display panel 01 has a better visual effect. In addition, some of the bypass portions of the first signal lines L1 corresponding to the first optical component area B1 are arranged in the first frame area B11, so these bypass portions do not need to be arranged in the display area AA, thereby avoiding that the number of the first signal lines L1 whose bypass portions are arranged in the display area AA is too large and reducing the lengths of these bypass portions. In this way, the first signal lines L1 corresponding to the first optical component area B1 do not have too large loads, so that the losses of the signals transmitted by different first signal lines L1 are relatively consistent, thereby achieving display uniformity of the display panel 01.

Figure 3:
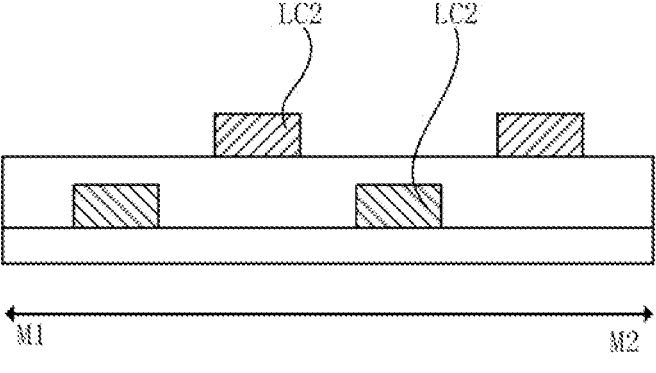
FIG. 3 is a cross-sectional view taken along line M1-M2 shown in FIG. 2.

FIG. 3 is a cross-sectional view taken along line M1-M2 shown in FIG. 2.

In some embodiments, as shown in FIG. 3, among the second bypass portions LC2 arranged in the first frame area B11, two adjacent second bypass portions LC2 arranged along the first direction X are located in different layers, then the second bypass portions LC2 arranged in the first frame area B11 can be arranged alternately in different layers. Therefore, the density of the second bypass portions LC2 in the first frame area B11 can be larger. In this way, a line width and a line pitch in a same metal layer can both be increased, thereby avoiding the loss of yield when the line width and line pitch are close to the minimum line width and the minimum line pitch required by the process. Moreover, a distance between adjacent signal lines can be increased by arranging the adjacent signal lines in different layers, thereby reducing crosstalk between adjacent signal lines. Further, an insulating film between adjacent second bypass portions LC2 may be an organic insulating film, and the crosstalk can be further reduced by increasing a thickness of the insulating film.

Figure 4:
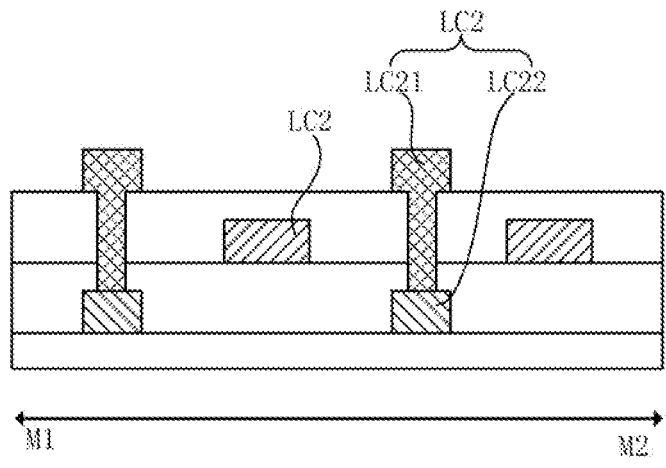
FIG. 4 is another cross-sectional view taken along line M1-M2 shown in FIG. 2.

FIG. 4 is another cross-sectional view taken along line M1-M2 shown in FIG. 2.

As shown in FIG. 4, among the second bypass portions LC2 arranged in the first frame area B11, at least one second bypass portion LC2 includes a first bypass sub-portion LC21 and a second bypass sub-portion LC22 located in different layers and electrically connected to each other. That is, at least one of the second bypass portions LC2 arranged in the first frame area B11 each may be formed by a first bypass sub-portion LC21 and a second bypass sub-portion LC22 that are located in different layers and connected in parallel. A width of the second bypass portion LC2 formed by the parallel connection of the first bypass sub-portion LC21 and the second bypass sub-portion LC22 can be smaller than that of any other second bypass portion LC2, but the second bypass portion LC2 formed by the parallel connection of the first bypass sub-portion LC21 and the second bypass sub-portion LC22 can still have a higher conductivity, and the density of the second bypass portions LC2 in the first frame area B11 can be further increased. Especially when the second bypass portion LC2 is implemented by a metal layer with a higher resistance, the parallel connection of bypass sub-portions in multiple layers can be adopted to reduce the resistance.

Figure 5:
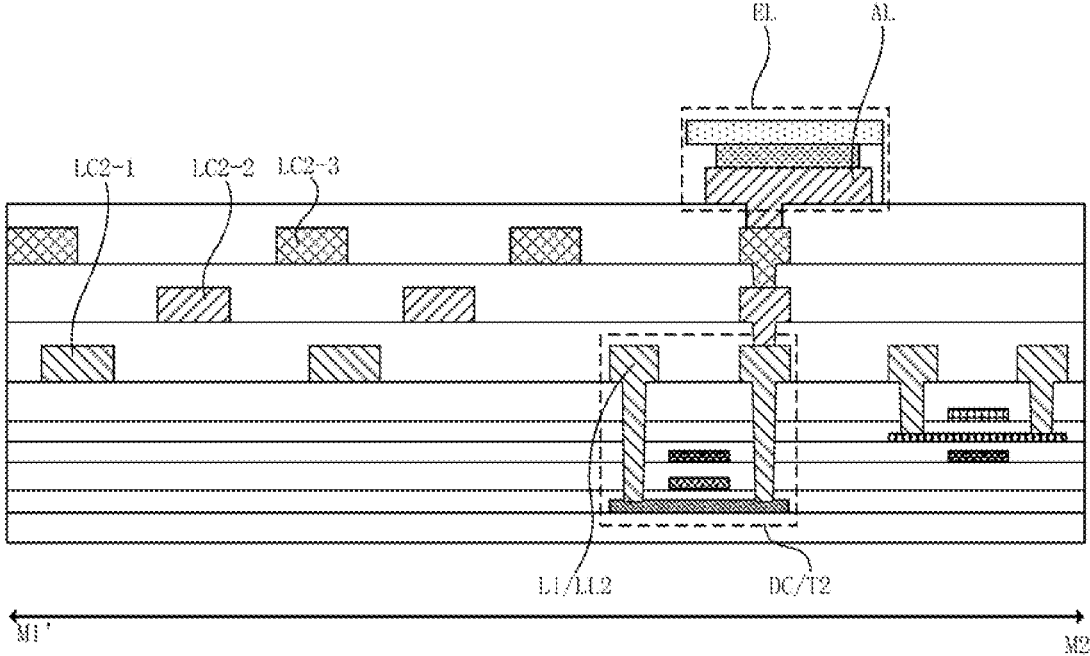
FIG. 5 is a cross-sectional view taken along line M1'-M2' shown in FIG. 2.

FIG. 5 is a cross-sectional view taken along line M1'-M2' shown in FIG. 2. In order to minimize the width occupied by the second bypass portions LC2 without reducing the quantity of the second bypass portions LC2, multiple metal layers can be used for the bypass portion design, and adjacent second bypass portions LC2 may be located in different metal layers. For example, as shown in FIG. 5, three metal layers are provided for the bypass portion design. The second bypass portion LC2-1 located in a first metal layer is adjacent to the second bypass portion LC2-2 located in a second metal layer, and the second bypass portion LC2-2 located in the second metal layer is adjacent to the second bypass portion LC-3 located in a third metal layer, so that a distance between adjacent second bypass portions LC2 can be large, thereby reducing a parasitic capacitance thereof and thus reducing the crosstalk. In addition, these metal layers may be separated by organic insulating films, and the distance between adjacent second bypass portions LC2 can be further increased. Under this premise, since the first metal layer and the third metal layer are spaced by two organic insulating films, the second bypass portion LC2-3 located in the third metal layer and the second bypass portion LC2-1 located in the first metal layer may partially overlap each other. Due to the presence of the two organic insulating films, the parasitic capacitance between the second bypass portion LC2-1 and the second bypass portion LC2-3 can be greatly reduced. Therefore, even if the second bypass portion LC2-1 and the second bypass portion LC2-3 partially overlap each other, it is difficult to form a sufficient crosstalk to affect the display effect.

Figure 6:
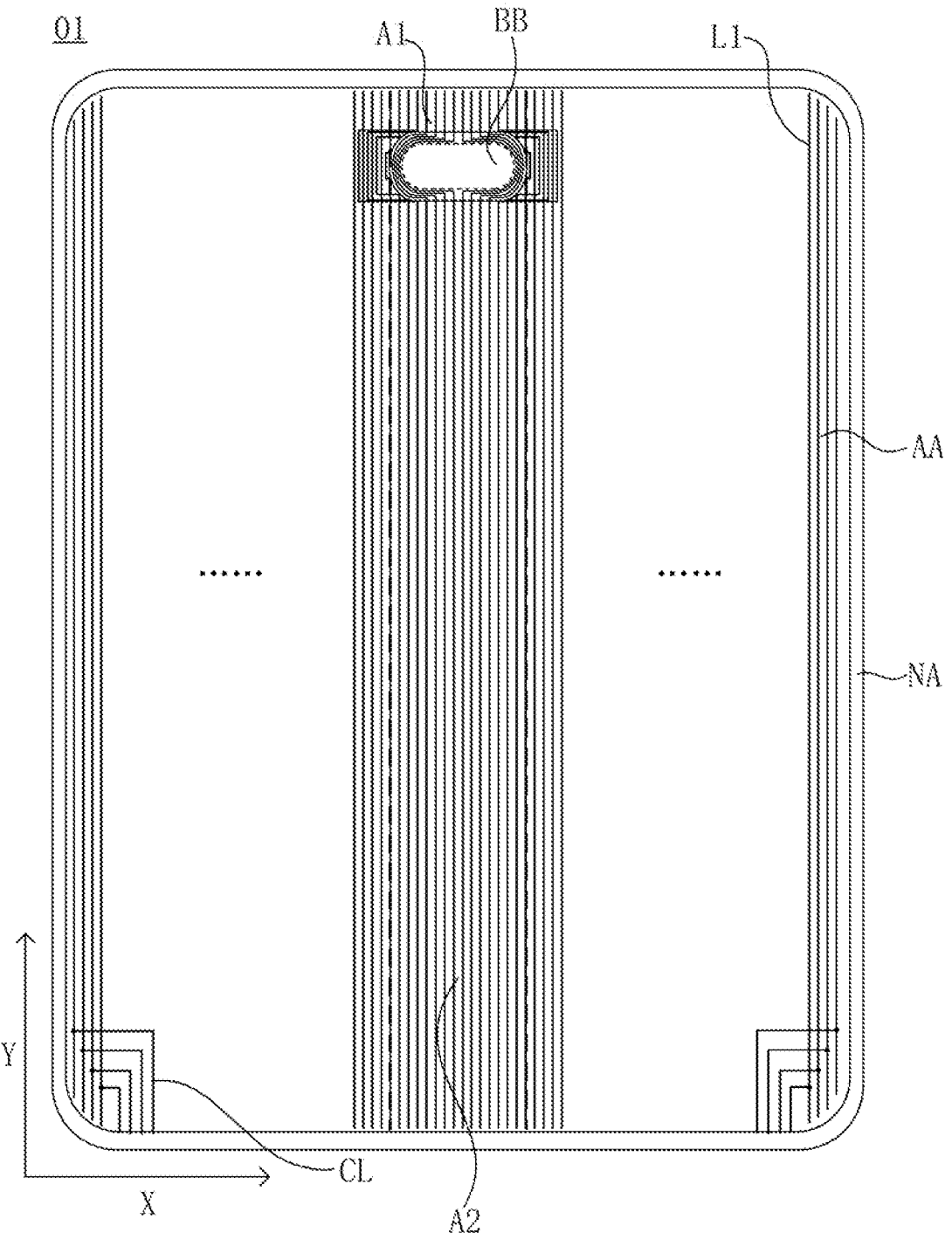
FIG. 6 is a schematic diagram of a display panel according to an embodiment of the present disclosure.

FIG. 6 is a schematic diagram of a display panel according to an embodiment of the present disclosure.

As shown in FIG. 4, FIG. 5 and FIG. 6, the second bypass sub-portion LC22 may be arranged in the same layer as the first portion LL1 and the second portion LL2 of the first signal line L1, and the first bypass sub-portion LC21 may be arranged in the same layer as a transition connection line CL.

The first signal line L1 arranged in the display area AA corresponding to the chamfered position of the display panel 01 can be electrically connected to a fan-shaped line arranged in the non-display area NA through the transition connection line CL arranged in the display area AA, so that the non-display area NA at the chamfered position of the display panel 01 has a smaller width.

In an example, the transition connection line CL can adopt the following two configurations. When the first signal line L10 and the transition connection line CL are arranged in different layers, a portion of the transition connection line along the direction X and another portion of the transition connection line along the direction Y may be located in a same layer. When the first signal line L10 and a portion of the transition connection line CL are arranged in a same layer, a portion of the transition connection line along the direction Y and the data line are arranged in a same layer, and another portion of the transition connection line along the direction X and the data line are arranged in different layers.

Figure 7:
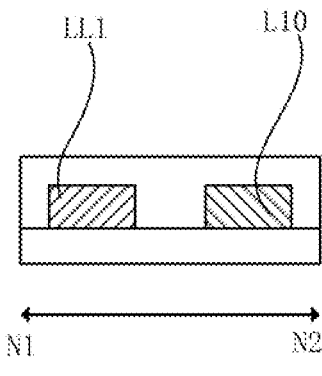
FIG. 7 is a cross-sectional view taken along line N1-N2 shown in FIG. 2.

FIG. 7 is a cross-sectional view taken along line N1-N2 shown in FIG. 2.

In addition, as shown in FIG. 2 and FIG. 6, the first signal lines L1 of the display panel 01 further include normal first signal lines L10. The normal first signal line L10 is different from the first-type signal line L11 and the second-type signal line L12 in that, the normal first signal line L10 always extends along the second direction Y in the display area AA and does not pass the first optical component area B1. Then, as shown in FIG. 7, the normal first signal line L10 may be arranged in the same layer as the first portion LL1 and/or the second portion LL2 of the first signal line L1. When the first portion LL1 and the second portion LL2 are arranged in a same layer, the normal first signal line L10 is arranged in the same layer as the first portion LL1 and the second portion LL2.

It can be understood that the first bypass portion LC1 and the normal first signal line L10 are arranged in different layers, so that the first bypass portion LC1 can be arranged in the display area AA and is not electrically connected to the normal first signal line L10. In an example, the portion of the first bypass portion LC1 extending along the first direction X and the normal first signal line L10 are arranged in different layers, so that a short circuit caused by crossing can be avoided. The portion of the first bypass portion LC1 extending along the second direction Y can be arranged in the same layer as the normal first signal line L10, thereby avoiding a problem that the metal film layer cannot be reused since the first bypass portion LC1 includes portions extending in two directions.

Figure 8:
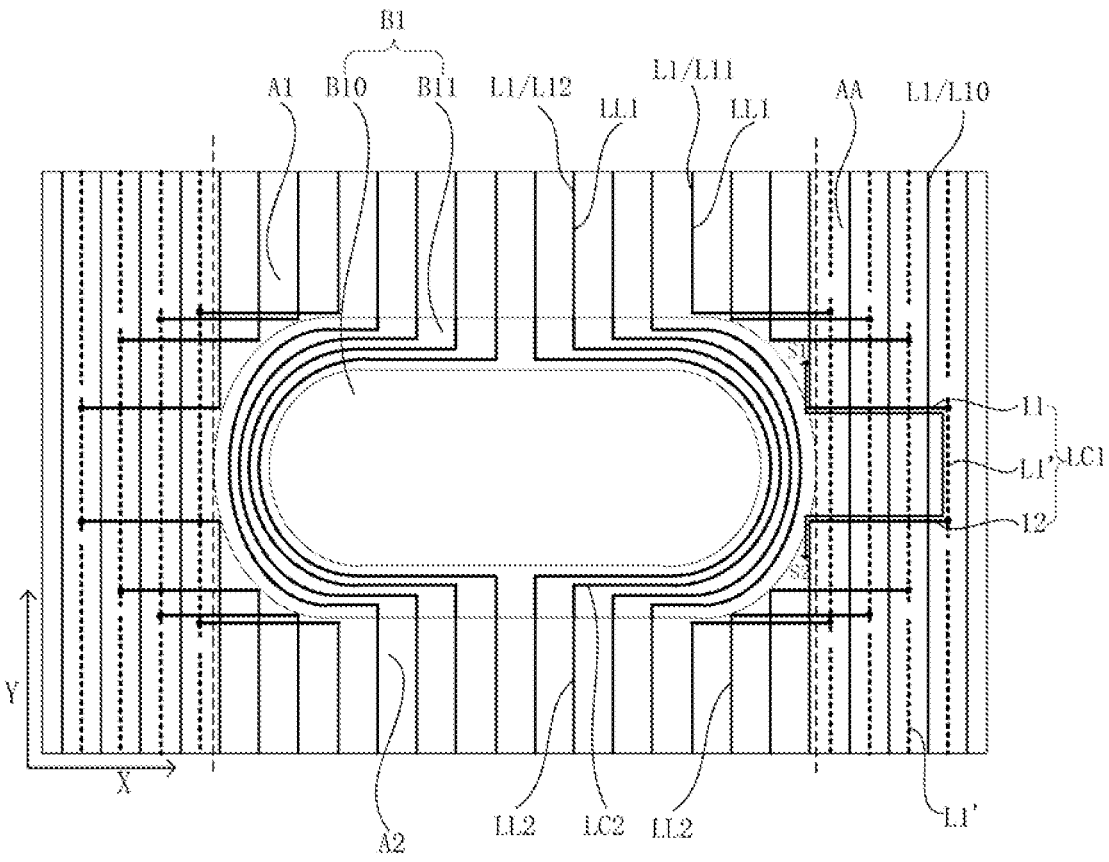
FIG. 8 is a partial schematic diagram of a display panel according to an embodiment of the present disclosure.
Figure 9A:
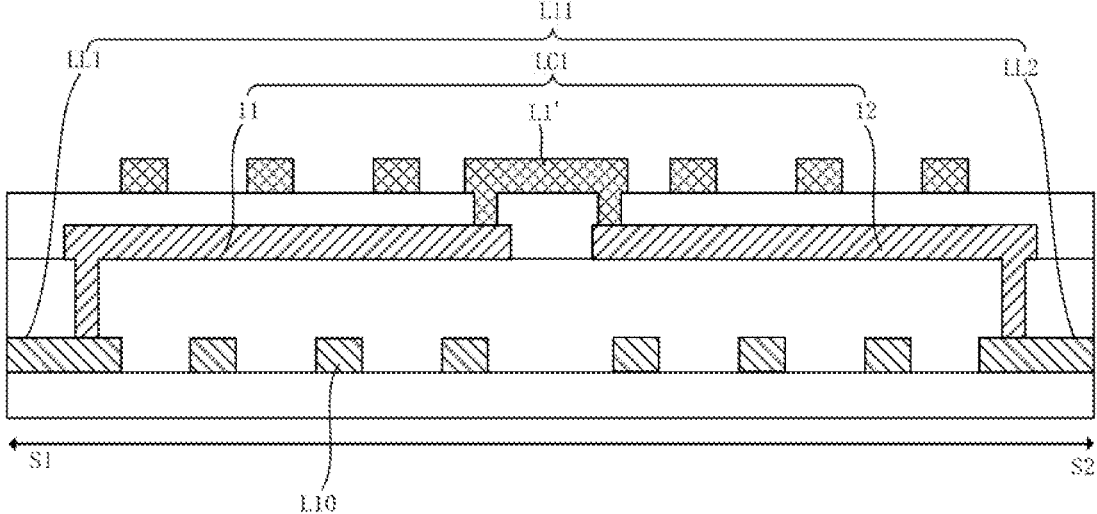
FIG. 9A is a cross-sectional view taken along line S1-S2 shown in FIG. 8.

FIG. 8 is a partial schematic diagram of a display panel according to an embodiment of the present disclosure. FIG. 9A is a cross-sectional view taken along line S1-S2 shown in FIG. 8.

As shown in FIG. 8 and FIG. 9A, the display panel 01 includes dummy first signal lines L1', and the dummy first signal lines L1' are arranged in the display area AA and extend along the second direction Y. Then, the dummy first signal line L1' can be arranged in parallel with the normal first signal line L10. In order to reduce a risk of a short circuit between the dummy first signal line L1' and the normal first signal line L10, the dummy first signal line L1' is arranged in a different layer from the normal first signal line L10, and accordingly the dummy first signal line L1' is arranged in a different layer from the first portion LL1 and/or the second portion LL2. When the first portion LL1 and the second portion LL2 are arranged in a same layer, the dummy first signal line L1' is arranged in a different layer from the first portion LL1 and the second portion LL2. In this case, the first bypass portion LC1 can be arranged in the same layer as the dummy first signal line L1'.

Figure 9B:
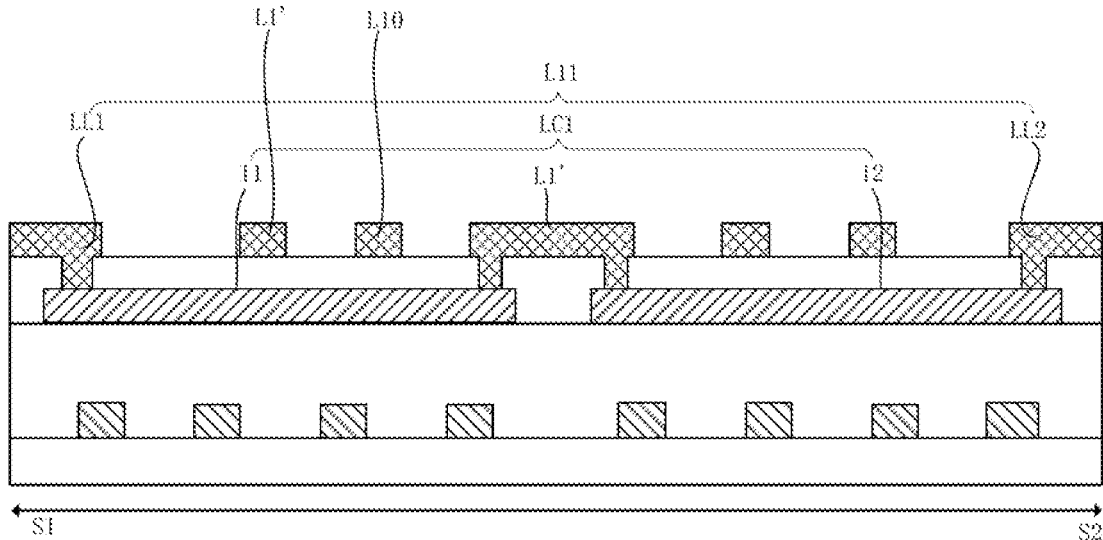
FIG. 9B is another cross-sectional view taken along line S1-S2 shown in FIG. 8.

In another embodiment of the present disclosure, please refer to FIG. 9B, which is another cross-sectional view taken along line S1-S2 shown in FIG. 8. The display panel 01 includes dummy first signal lines L1', and the dummy first signal lines L1' are arranged in the display area AA and extend along the second direction Y. Then, the dummy first signal line L' can be arranged in parallel with the normal first signal line L10. The dummy first signal line L1' is arranged in the same layer as the normal first signal line L10, then the dummy first signal line L1' is arranged in the same layer as the first portion LL1 and/or the second portion LL2. A first section 11 and a second section 12 of the first bypass portion along the first direction X are arranged in a different layer from the dummy first signal line L1' corresponding to the first bypass portion along the second direction Y.

Referring to FIG. 8 and FIG. 6, the dummy first signal line L1' and the transition connection line CL can be arranged in a same layer, that is, the dummy first signal line L1' and the transition connection line CL can be formed at the same time. In an example, the transition connection line CL can adopt the following two configurations. When the normal first signal line L10 and the transition connection line CL are in different layers, a portion of the transition connection line along the first direction X and another portion of the transition connection line along the second direction Y may be arranged in a same layer. When the normal first signal line L10 and a portion of the transition connection line CL are arranged in a same layer, a portion of the transition connection line along the second direction Y is arranged in the same layer as the data line, and another portion of the transition connection line along the first direction X is arranged in a different layer from the data line.

In some embodiments, as shown in FIG. 8, the first bypass portion LC1 includes a first section 11 and a second section 12. The first section 11 may be a portion extending along the first direction X as shown in FIG. 8, and the first section 11 connects the first portion LL1 and the dummy first signal line L1'. The second section 12 may be another portion extending along the first direction X as shown in FIG. 8, and the second section 12 connects the second portion LL2 and the dummy first signal line L1'. As a result, the first section 11 and the second section 12 of a same first-type signal line L11 or a same second-type signal line L12 are electrically connected to the dummy first signal line L1'. Then, the dummy first signal line L1' electrically connected to the first section 11 and the second section 12 can be regarded as being reused as a portion of the first bypass portion LC1.

Figure 10:
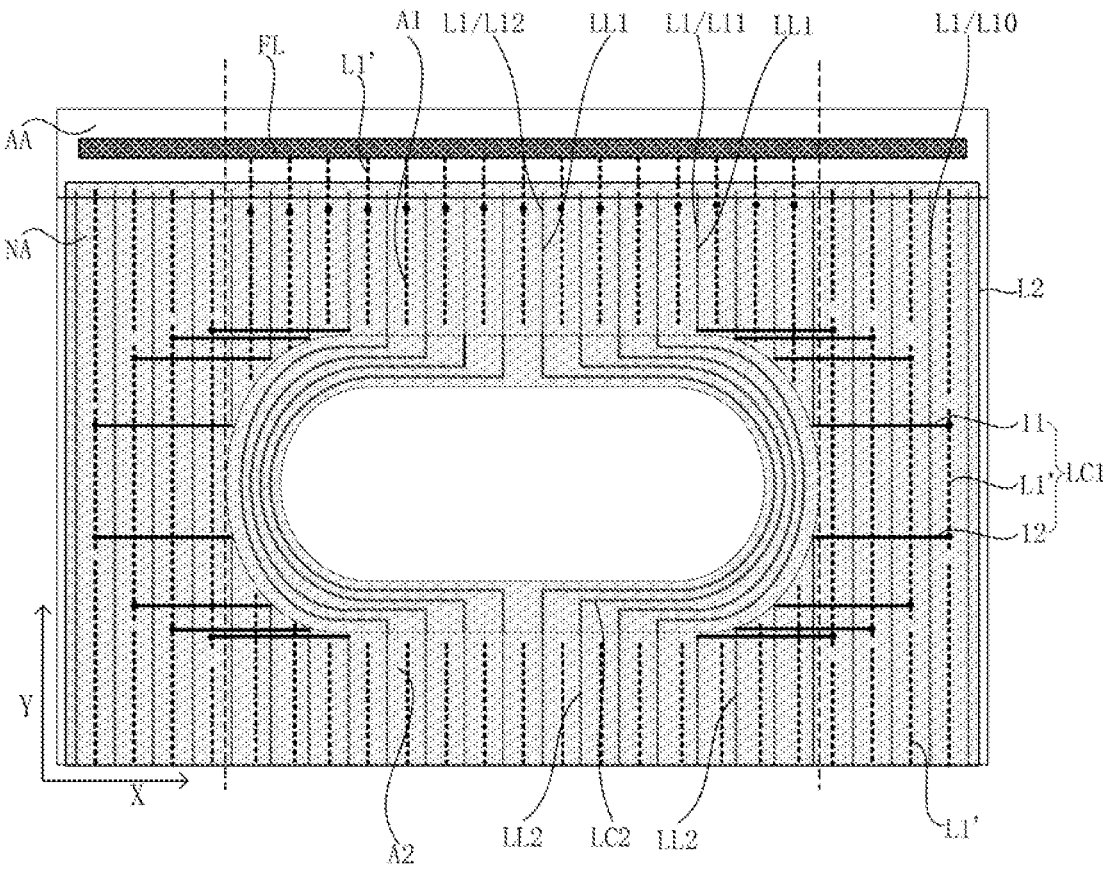
FIG. 10 is a partial schematic diagram of a display panel according to an embodiment of the present disclosure.

FIG. 10 is a partial schematic diagram of a display panel according to an embodiment of the present disclosure.

In some embodiments of the present disclosure, as shown in FIG. 10, the display panel further includes a second signal line L2 provided in the display area AA and a fixed potential line FL provided in the non-display area NA. The fixed potential line FL is electrically connected to the second signal line L2 through one or more dummy first signal lines L1'. It should be noted that, for the sake of aesthetics, not all the second signal lines L2 are shown in the figure. In addition, a supplementary signal line may be provided, and the supplementary signal line at least partially surrounds the first light-transmission area B10. The fixed potential line FL can be electrically connected to the supplementary signal line by using the same metal layer as the dummy first signal line L1', so that the fixed potential signal in the display area is more uniformly distributed.

Along the second direction Y, the first optical component area B1 in the display panel 01 can be disposed adjacent to one edge of the display panel 01. As shown in FIG. 1, the first optical component area B1 is disposed adjacent to an upper frame of the display panel 01, for example, a width of the second display area A2 along the second direction Y is smaller than a width of the first display area A1 along the second direction Y.

Then, in a frame area of the display panel 01, the fixed potential line FL disposed in a frame area at a side of the second display area A2 away from the first display area A1 can be electrically connected to the second signal line L2 through one or more dummy first signal line L1'. It can be understood that the dummy first signal line L1' electrically connecting the fixed potential line FL and the second signal line L2 is electrically insulated from the dummy first signal line L1' electrically connecting the first section 11 and the second section 12.

Figure 11:
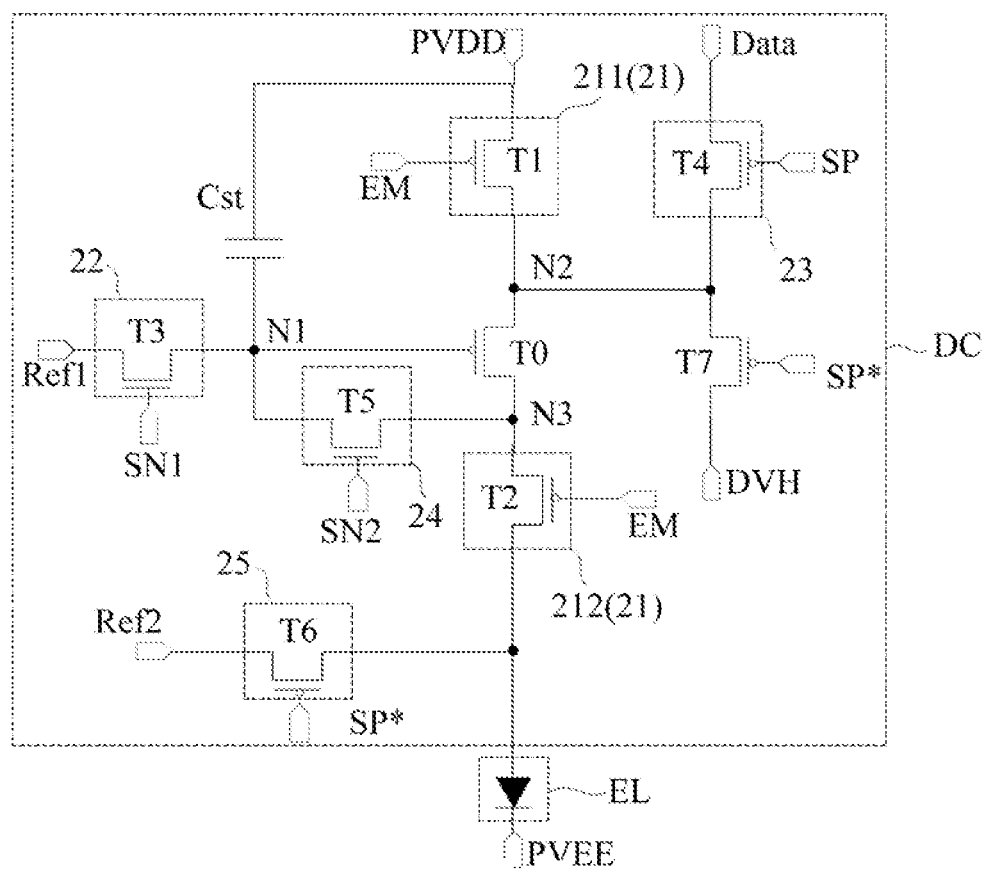
FIG. 11 is an equivalent schematic diagram of a pixel circuit according to an embodiment of the present disclosure.
Figure 12:
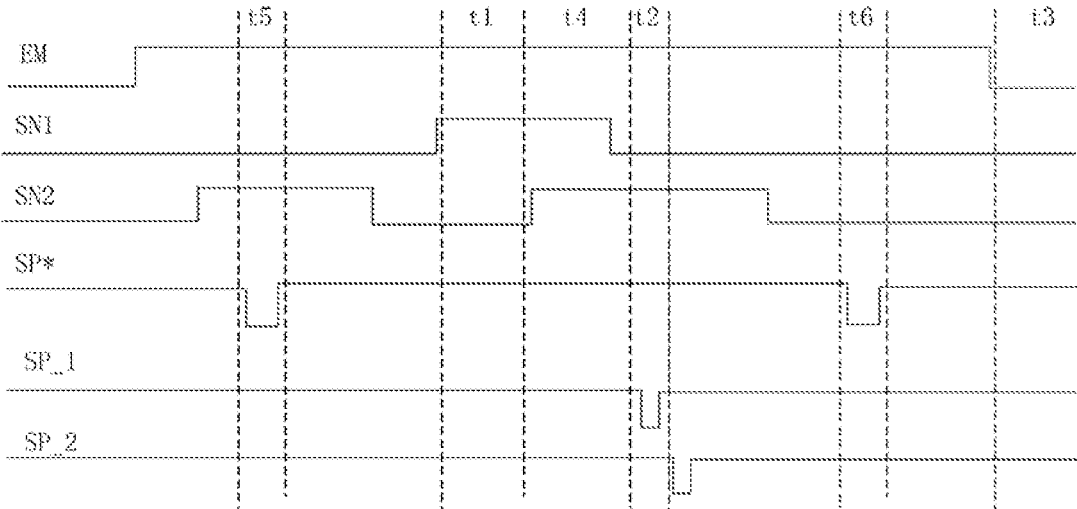
FIG. 12 is a working timing diagram corresponding to the pixel circuit shown in FIG. 11.

FIG. 11 is an equivalent schematic diagram of a pixel circuit according to an embodiment of the present disclosure. FIG. 12 is a working timing diagram corresponding to the pixel circuit shown in FIG. 11.

In an example, as shown in FIG. 11, the sub-pixel of the display panel 01 includes a pixel circuit DC and a light-emitting element EL that are electrically connected to each other, and the pixel circuit DC provides a light-emitting drive current for the light-emitting device EL. The pixel circuit DC includes a driving transistor T0, a light-emitting control circuit 21, a gate reset circuit 22, a data input circuit 23, a threshold compensation circuit 24, and a light-emitting element reset circuit 25.

The driving transistor T0 includes a control electrode electrically connected to a first node N1, a first electrode electrically connected to a second node N2, and a second electrode electrically connected to a third node N3.

The light-emitting control circuit 21 includes a first control sub-circuit 211 and a second control sub-circuit 212. The first control sub-circuit 211 includes an input terminal electrically connected to a first power supply voltage line PVDD, and an output terminal electrically connected to the first electrode of the driving transistor T0. The second control sub-circuit 212 includes an input terminal electrically connected to the second electrode of the driving transistor T0, and an output terminal electrically connected to a first electrode of the light-emitting element EL. A second electrode of the light-emitting element EL is electrically connected to a second power supply voltage line PVEE. Each of a control terminal of the first control sub-circuit 211 and a control terminal of the second control sub-circuit 212 is electrically connected to a light-emitting control signal line EM.

The gate reset circuit 22 includes a control terminal electrically connected to a first scan control signal line SN1, an input terminal electrically connected to a first reset signal line Ref1, and an output terminal electrically connected to the gate electrode of the driving transistor T0.

The data input circuit 23 includes a control terminal electrically connected to a second scan control signal line SP, an input terminal electrically connected to a data line Data, and an output terminal electrically connected to the first electrode of the driving transistor T0.

The threshold compensation circuit 24 includes a control terminal electrically connected to a third scan control signal line SN2, an input terminal electrically connected to the second electrode of the driving transistor T0, and an output terminal electrically connected to the gate electrode of the driving transistor T0.

The light-emitting element reset circuit 25 includes a control terminal electrically connected to a fourth scan control signal line SP*, an input terminal electrically connected to a second reset signal line Ref2, and an output terminal electrically connected to the first electrode of the light-emitting element EL.

The second electrode of the light-emitting element EL is electrically connected to the second power supply voltage line PVEE.

In an example, as shown in FIG. 11, the first control sub-circuit 211 includes a first transistor T1, the second control sub-circuit 212 includes a second transistor T2, the gate reset circuit 22 includes a third transistor T3, the data input circuit 23 includes a fourth transistor T4, the threshold compensation circuit 24 includes a fifth transistor T5, and the light-emitting element reset circuit 25 includes a sixth transistor T6. The pixel circuit DC further includes a storage capacitor Cst, including a first electrode electrically connected to the first node N1, and a second electrode electrically connected to the first power supply voltage line PVDD.

In an example, the third transistor T3 and the fifth transistor T5 may be oxide transistors, such as indium gallium zinc oxide (IGZO) transistors, so that the third transistor T3 and the fifth transistor T5 each have a small off-state leakage current, thereby improving the stability of a potential at the first node N1. In an example, when the display panel 01 performs displaying in a low frequency mode, the potential at the first node N1 needs to be maintained for a long time. In this case, the third transistor T3 and the fifth transistor T5 electrically connected to the first node N1 are indium gallium zinc oxide transistors, so that the brightness uniformity of the light-emitting element EL at a low frequency mode can be improved.

In addition, in the embodiments of the present disclosure, a bias transistor T7 may be provided to alleviate the hysteresis of the driving transistor T0, so that the display panel does not flicker at a lower driving frequency.

As shown in FIG. 12, a working process of the pixel circuit DC includes a reset stage t1, a charging stage t2 and a light-emitting stage t3.

At the reset stage t1, the first scan control signal line SN1 controls the third transistor T3 to be turned on, and the first reset signal provided by the first reset signal line Ref1 resets the first node N1 through the third transistor T3; the fourth scan control signal line SP* controls the sixth transistor T6 to be turned on, and the second reset signal provided by the second reset signal line Ref2 resets the light-emitting element EL through the sixth transistor T6. Exemplarily, the first reset signal and the second reset signal may be the same or be different.

In addition, resetting the light-emitting element EL through the sixth transistor T6 and resetting the first node N1 through the third transistor T3 may be performed simultaneously, or may be performed at different stages. For example, in some embodiments, resetting the light-emitting element EL through the sixth transistor T6 may be performed at the charging stage t2.

At the charging stage t2, the second scan control signal line SP controls the fourth transistor T4 to be turned on, the data voltage $V_{data}$ provided by the data line Data is supplied to the second node N2 through the fourth transistor T4, and the driving transistor T0 is turned on. At this stage, the third scan control signal line SN2 controls the fifth transistor T5 to be turned on. During this process, a potential at the first node N1 changes continuously until the potential $V_{N1}$ at the first node N1 changes to be $V_{N1}=V_{data}-|V_{th}|$, where $V_{th}$ is a threshold voltage of the driving transistor T0.

At the light-emitting stage t3, the first transistor T1, the second transistor T2 and the driving transistor T0 are turned on; the third transistor T3, the fourth transistor T4 and the fifth transistor T5 are turned off; and the light-emitting element electrically connected to the pixel circuit DC EL emits light.

In the embodiments of the present disclosure, the first signal line L1 may be a data line Data, and the second signal line may be one of the first power supply voltage line PVDD or the second power supply voltage line PVEE. As shown in FIG. 10, when the second signal line L2 is the second power supply voltage line PVEE, the second signal line L2 may be an entire-surface structure, and the second signal line L2 can be reused as a cathode of the light-emitting element EL.

In the embodiments in which the bias transistor T7 is provided, the display panel may further include a third node reset stage t4, a first bias stage t5 and a second bias stage t6.

At the third node reset stage t4, the transistor T3 and the transistor T5 are turned on at the same time, and the third node N3 is reset to a low level.

At the first bias stage t5, the transistor T7 and the transistor T5 are turned on, and a bias signal DVH is supplied to the gate electrode of the driving transistor T0 to bias/turn on the driving transistor T0.

At the second bias stage t6, the transistor T7 is turned on to bias/turn on the driving transistor, thereby alleviating the hysteresis of the driving transistor T0.

It should be noted that, at a maintaining stage under the low frequency drive, the reset stage t1, the charging stage t2 and the third reset stage t4 may not be performed; and preferably, at least one of the first bias stage t5 and the second bias stage t6 needs to be performed. That is, under the low frequency drive, the light-emitting control signal line EM and the fourth scan control signal line SP* can be maintained in a same state as the high frequency drive, and other signal can be reduced in frequency to achieve the best balance between power consumption and display effect.

In addition, in order to reduce the space occupied by the shift register circuit in the frame area, the scan signal line can adopt a configuration in which one scan signal line drives two pixel rows and the shift register circuit is provided on one side of the frame area, thereby reducing the space occupied by the shift register circuit. For example, in an embodiment, one scan signal line driving two pixel rows is taken as an example. In this case, a first row of pixels and a second row of pixels share the light-emitting control signal line EM, the first scan control signal line SN1, the third scan control signal line SN2 and the fourth scan control signal line SP*, but do not share the second scan control signal line SP. The SP signal SP_1 of the first row of pixels and the SP signal SP_2 of the second row of pixels are staggered, so that their charging stages t2 can be staggered and the driving can be performed normally.

In some embodiments, as shown in FIG. 2, FIG. 8 and FIG. 10, along the first direction X, for two parts of the first frame area B11 located at two opposite sides of the first light-transmission area B10, the number of the second bypass portions LC2 arranged in the first part of the first frame area B11 located at the first side of the first light-transmission area B10 is the same as the number of the second bypass portions LC2 arranged in the second part of the first frame area B11 located at the second side of the first light-transmission area B10. As shown in FIG. 2, FIG. 8 and FIG. 10, the second bypass portions LC2 of the display panel 01 are equally distributed in the two parts of the first frame area B11 located at the left side and the right side of the first light-transmission area B10.

The number of the second bypass portions LC2 arranged in the part of the first frame area B11 located at one side of the first light-transmission area B10 is the same as the number of the second bypass portions LC2 arranged in the part of the first frame area B11 located at the other one side of the first light-transmission area B10, so that the first frame area B11 has a relatively consistent width.

In some embodiments, as shown in FIG. 2, FIG. 8 and FIG. 10, along the first direction X, for two parts of the display area AA located at two opposite sides of the first optical component area B1, the number of the first bypass portions LC1 arranged in the first part of the display area AA located at one side of the first optical component area B1 is the same as the number of the first bypass portions LC1 arranged in the part of the display area AA located at the other one side of the first optical component area B1. As shown in FIG. 2, FIG. 8 and FIG. 10, the second bypass portions LC2 of the display panel 01 are equally distributed in the two parts of the display area AA located at a left side and a right side of the first optical component area B1.

The number of the first bypass portions LC1 arranged in the part of the display area AA located at one side of the first optical component area B1 is the same as the number of the first bypass portions LC1 arranged in the part of the display area AA located at the other one side of the first optical component area B1, so that the first bypass portions LC1 arranged at two sides of the first optical component area B1 are consistent in length.

FIG. 13 is a partial schematic diagram of a display panel according to an embodiment of the present disclosure.

In some embodiments of the present disclosure, as shown in FIG. 13, in the first display area A1, along the first direction X, the first portions LL1 of the first-type signal lines L11 are arranged between the first portions LL1 of the second-type signal lines L12, that is, the first portions LL1 of the first-type signal lines L11 are collectively arranged and the first portions LL1 of the second-type signal lines L12 are grouped and arranged at two sides of the first portions LL1 of the first-type signal lines L11. And/or, in the second display area A2, along the first direction X, the second portions LL2 of the first-type signal lines L11 are arranged between the second portions LL2 of the second-type signal lines L12, that is, the second portions LL2 of the first-type signal lines L11 are collectively arranged and the second portions LL2 of the second-type signal lines L12 are grouped and arranged at two sides of the second portions LL2 of the first-type signal lines L11.

Figure 13A:
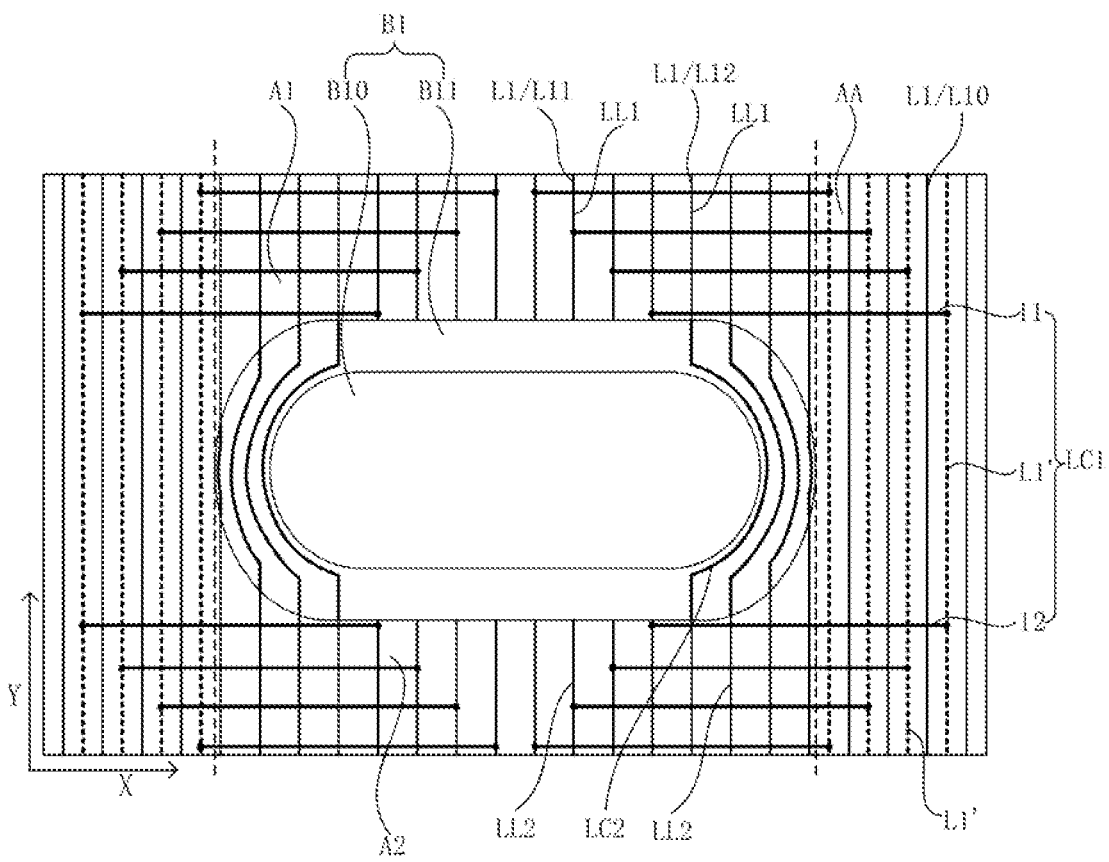
FIG. 13A is a partial schematic diagram of a display panel according to an embodiment of the present disclosure.

For example, as shown in FIG. 13A, along the first direction X, the first portions LL1 of the first-type signal lines L11 are arranged between the first portions LL1 of the second-type signal lines L12, and the second portions LL2 of the first-type signal line L11 are arranged between the second portions LL2 of the second-type signal lines L12.

In some embodiments of the present disclosure, in the first display area A1, along the first direction X, the first portions LL1 of the second-type signal lines L12 are arranged between the first portions LL1 of the first-type signal lines L11, that is, the first portions LL1 of the second-type signal lines L12 are collectively arranged and the first portions LL1 of the first-type signal lines L11 are grouped and arranged at two sides of the first portions LL1 of the second-type signal lines L12. And/or, in the second display area A2, along the first direction X, the second portions LL2 of the second-type signal lines L12 are arranged between the second portions LL2 of the first-type signal lines L11, that is, the second portions LL2 of the second-type signal lines L12 are collectively arranged and the second portions LL2 of the first-type signal lines L11 are grouped and arranged at two sides of the second portions LL2 of the second-type signal line L12.

Figure 13B:
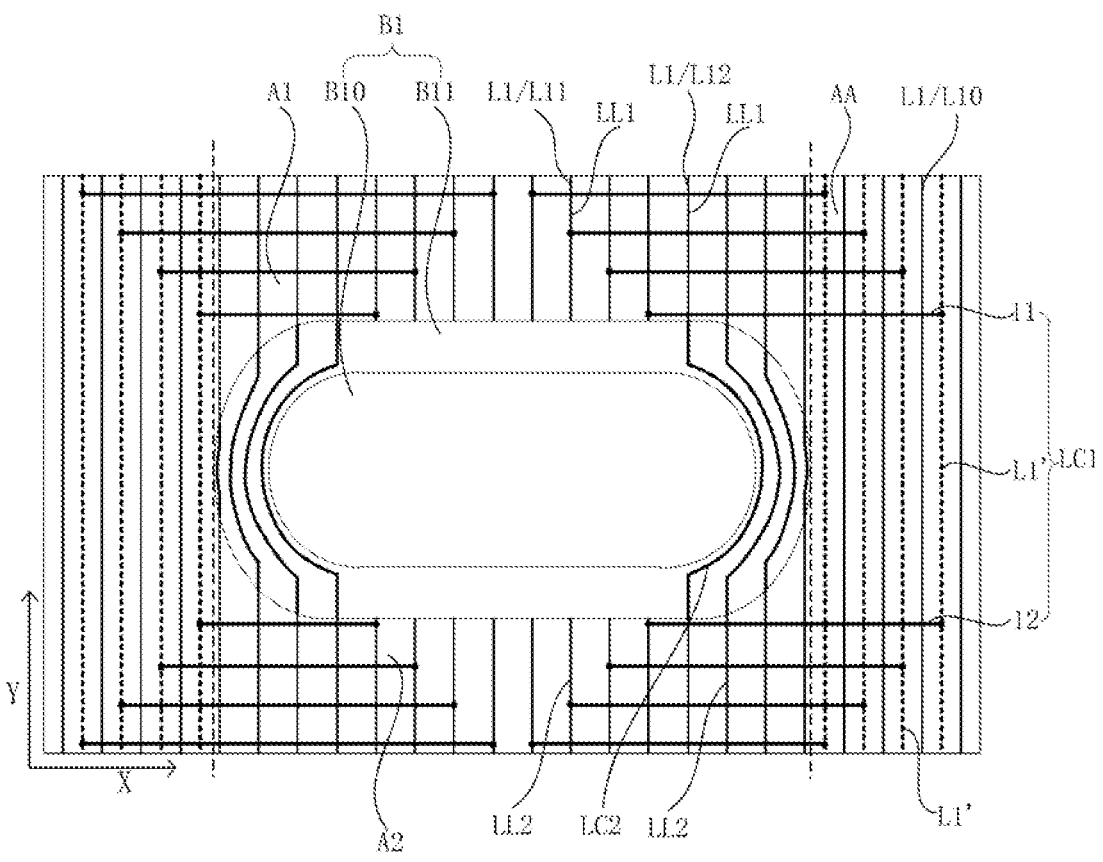
FIG. 13B is another partial schematic diagram of a display panel according to an embodiment of the present disclosure.

The embodiment shown in FIG. 13B differs from the embodiment shown in FIG. 13A in that, configurations of a connection via connecting the first portion LL1 of the first-type signal line L11 and the first section 11 and a connection via connecting the second portion LL2 of the first-type signal line L11 and the second section 12 in FIG. 13B are different from that in FIG. 13A; configurations of a connection via connecting the dummy first signal line L1' and the first section 11 and a connection via connecting the dummy first signal line L1' and the second section 12 in FIG. 13B are different from that in FIG. 13A; and a design of the first bypass portion LC1 at a left side of the first optical component area B1 may be different from a design of the first bypass portion LC1 at a right side of the first optical component area B1.

For example, as shown in FIG. 8 and FIG. 10, in the first display area A1, along the first direction X, the first portions LL1 of the second-type signal lines L12 are arranged between the first portions LL1 of the first-type signal lines L11, and the second portions LL2 of the second-type signal lines L12 are arranged between the second portions LL2 of the first-type signal lines L11.

Figure 14:
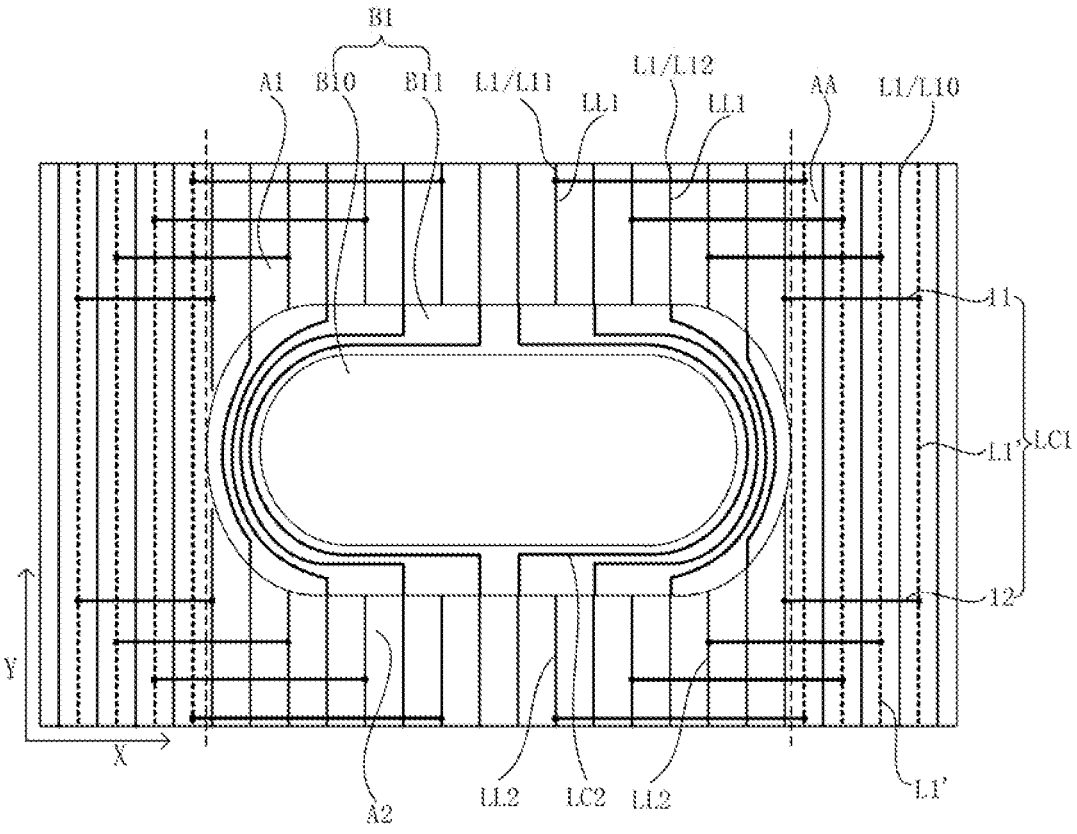
FIG. 14 is a partial schematic diagram of a display panel according to an embodiment of the present disclosure.

FIG. 14 is a partial schematic diagram of a display panel according to an embodiment of the present disclosure.

In some embodiments of the present disclosure, in the first display area A1, along the first direction X, the first portions LL1 of the first-type signal lines L11 and the first portions LL1 of the second-type signal lines L12 are alternately arranged, for example, the first portions LL1 of the first-type signal lines L11 and the first portions LL1 of the second-type signal lines L12 may be alternately arranged cyclically. And/or, in the second display area A2, along the first direction X, the second portions LL2 of the first-type signal lines L11 and the second portions LL2 of the second-type signal lines L12 are alternately arranged, for example, the second portions LL2 of the first-type signal lines L11 and the second portions LL2 of the second-type signal lines L12 may be alternately arranged cyclically. The connection via between the first portion LL1 and the first section 11 and the connection via between the second portion LL2 and the second section 12 can be distributed more dispersedly. In this way, it can avoid a visibility problem caused by the large-diameter and densely distributed connection vias in the organic insulating layer and can also avoid that the connection via between the second bypass portions LC2 and the first portion LL1 and the connection via between the second bypass portions LC2 and the second portion LL2 are too dense locally and cause a layout problem.

For example, as shown in FIG. 14, in the first display area A1, a ratio of the number of the first portions LL1 of the first-type signal lines L11 to the number of the first portions LL1 of the second-type signal lines L12 is equal to 1:1, and the first portions LL1 of the first-type signal lines L11 are alternately arranged with the first portions LL1 of the second-type signal lines L12 one by one cyclically; and in the second display area A2, a ratio of the number of the second portions LL2 of the first-type signal lines L11 to the number of the second portions LL2 of the second-type signal lines L12 is equal to 1:1, and the second portions LL2 of the first-type signal lines L11 are alternately arranged with the second portions LL2 of the second-type signal lines L12 one by one cyclically.

In an example, in the first display area A1, a ratio of the number of the first portions LL1 of the first-type signal lines L11 to the number of the first portions LL1 of the second-type signal lines L12 is equal to M:N, and the first portions LL1 of M first-type signal lines L11 are arranged alternately with the first portions LL1 of N second-type signal lines L12 cyclically; and in the second display area A2, a ratio of the number of the second portions LL2 of the first-type signal lines L11 to the number of the second portions LL2 of the second-type signal lines L12 is M:N, and the second portions LL2 of M first-type signal lines L11 are arranged alternately with the second portions LL2 of N second-type signal lines L12 cyclically.

In another embodiment of the present disclosure, the first portions LL1 of the first-type signal lines L11 and the first portions LL1 of the second-type signal lines L12 can adopt the collectively configuration manner as shown in FIG. 13 in a partial region and adopt the alternately or cyclically arrangement manner as shown in FIG. 14 in another partial region.

Figure 15:
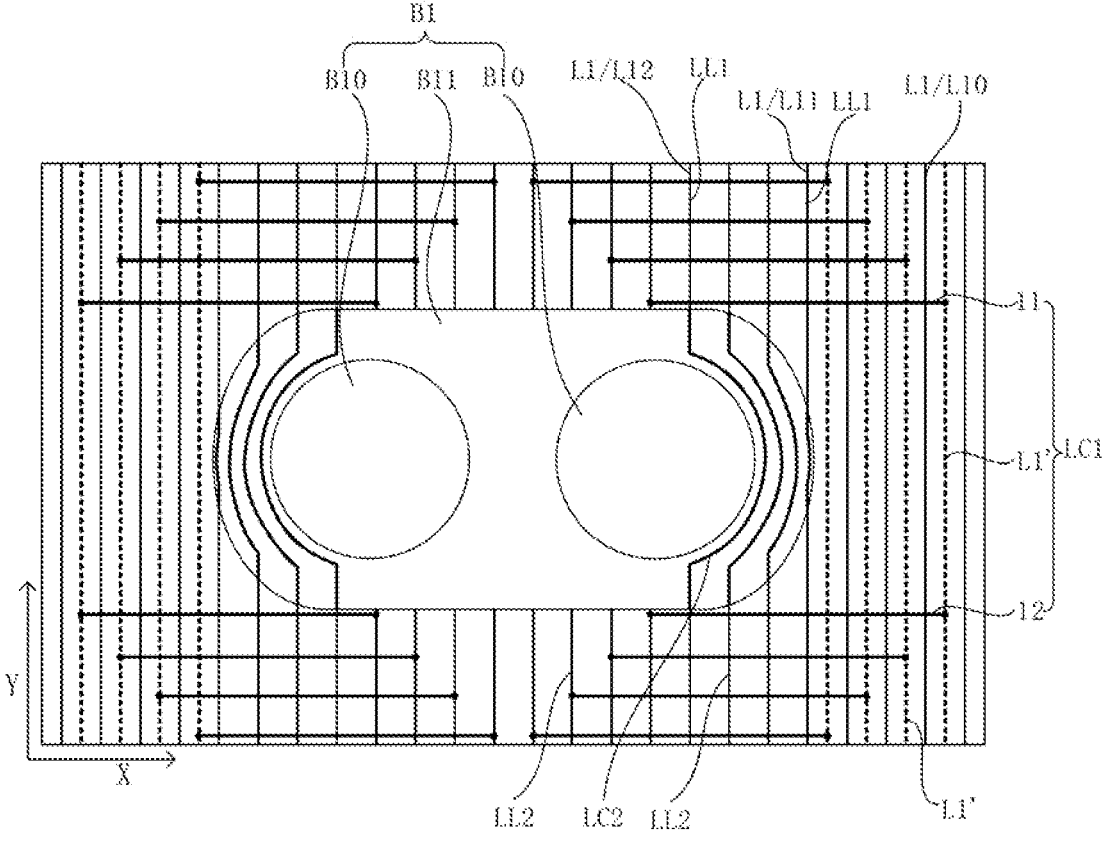
FIG. 15 is a partial schematic diagram of a display panel according to an embodiment of the present disclosure.
Figure 16:
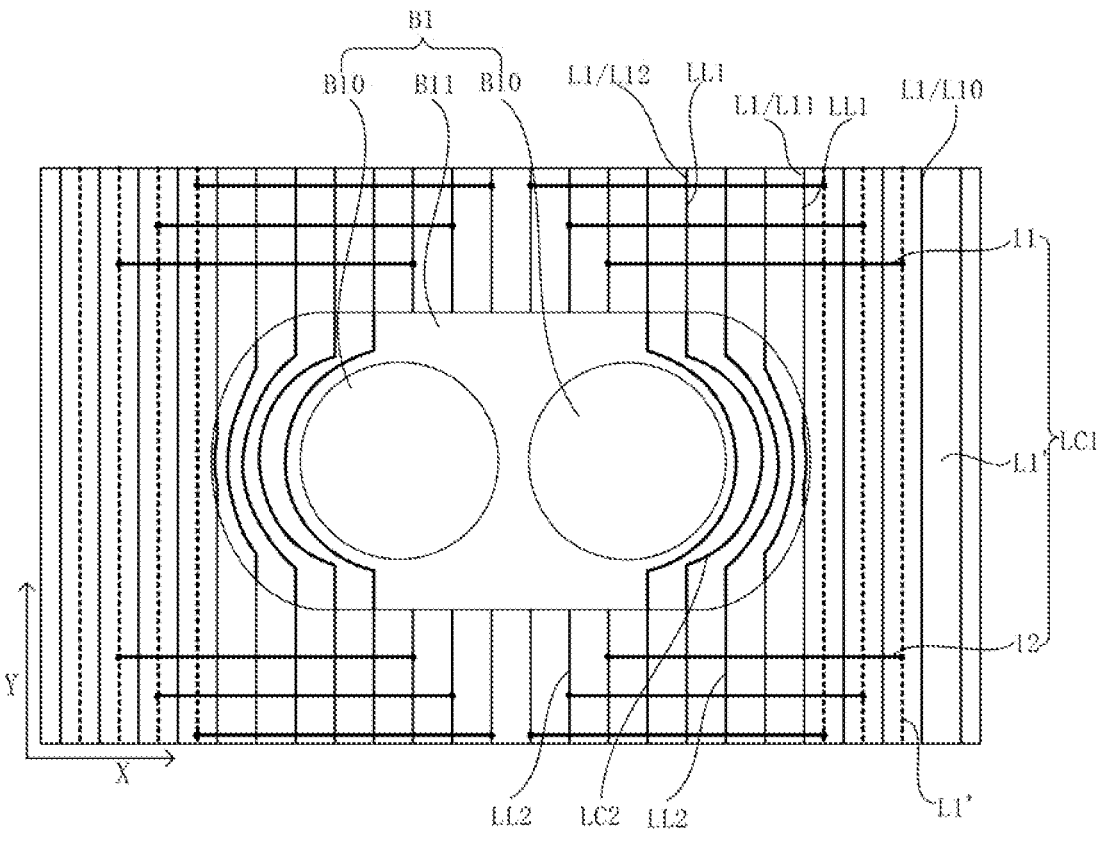
FIG. 16 is a partial schematic diagram of a display panel according to an embodiment of the present disclosure.

FIG. 15 is a partial schematic diagram of a display panel according to an embodiment of the present disclosure. FIG. 16 is a partial schematic diagram of a display panel according to an embodiment of the present disclosure.

In some embodiments of the present disclosure, as shown in FIG. 15 and FIG. 16, at least two optical components may be provided at the first optical component area B1 along the first direction X, and the first optical component area B1 includes at least two first light-transmission areas B10 arranged along the first direction X.

The first light-transmission area B10 may be a circular area. Correspondingly, in order to effectively utilize the space of the first frame area B11 and avoid excessive occupation of the display area AA of the display panel 01 by the first frame area B11, two side edges of the first frame area B11 opposite along the first direction X are arc-shaped structures, so that the two side edges are as parallel as possible to edges of the first light-transmission area B10.

In some embodiments of the present disclosure, as shown in FIG. 15, a circular center of the first light-transmission area B10 basically coincides with a circular center of the side edge of its adjacent first frame area. In this case, the edge of the first frame area B11 arranged at each of two sides of the first optical component area B1 along the first direction X is respectively parallel to the edge of the first light-transmission area B10 adjacent thereto. When arranging the second bypass portion LC2 in the first frame area B11, the space where the second bypass portion LC2 cannot be arranged will not be wasted too much.

In some embodiments of the present disclosure, as shown in FIG. 16, along the first direction X, among the two first light-transmission areas B10 located at two sides of the first optical component area B1, a circular center of one of the two first light-transmission areas B10 is offset to the other one of the two first light-transmission areas B10 with respect to a circular center of the side edge of the first frame area B11 adjacent thereto. In other words, each of the two first light-transmission areas B10 at two sides of the first optical component area B1 is adjacent to a center of the first optical component area B1, in this case, a width of the first frame area B11 at each of two sides of the first optical component area B1 arranged along the first direction X can be increased, so that more second bypass portions LC2 can be arranged in the first frame area B11 at each of the two sides of the first optical component area B1.

It should be noted that, in another embodiment of the present disclosure, some of the second bypass portions LC2 are at least partially located between the two first light-transmission areas B10 of the first optical component area B1. The non-display space can be fully utilized to reduce the width of the first frame area B11.

Figure 17:
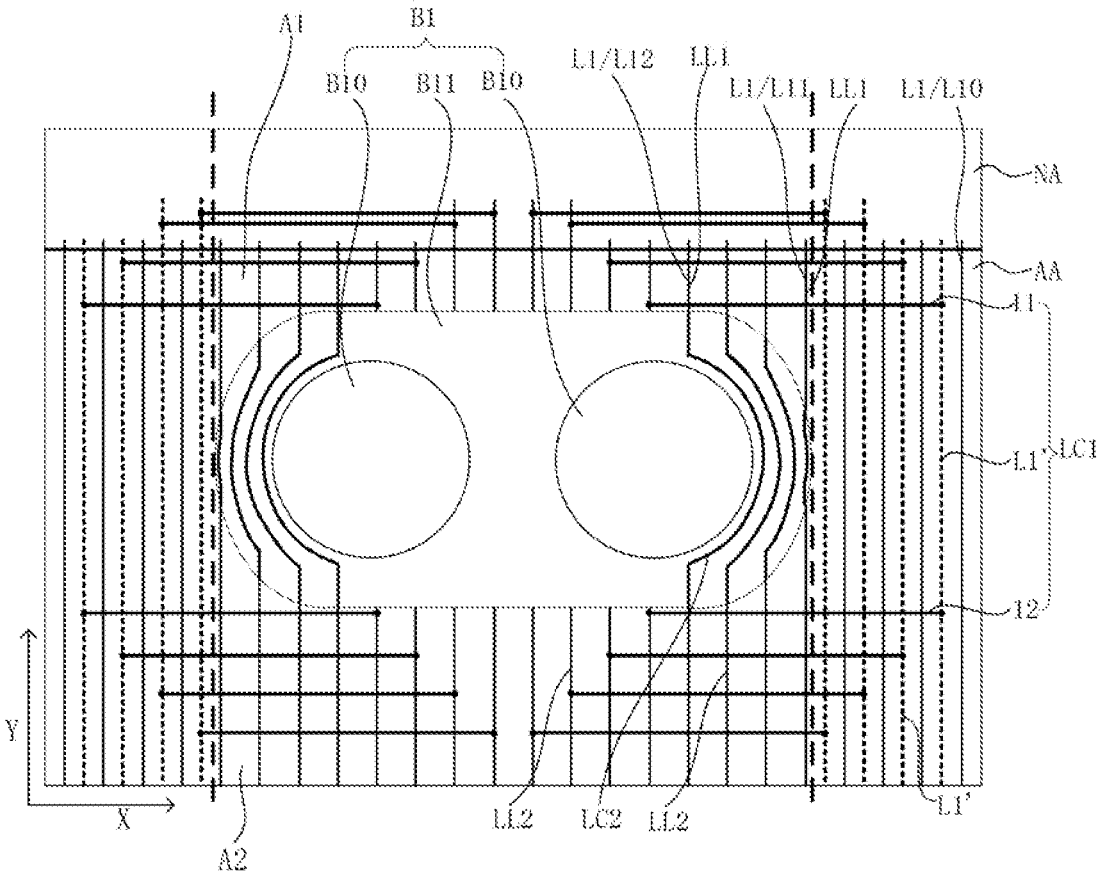
FIG. 17 is a partial schematic diagram of a display panel according to an embodiment of the present disclosure.

FIG. 17 is a partial schematic diagram of a display panel according to an embodiment of the present disclosure.

As described in the previous embodiments, the first optical component area B1 is usually arranged adjacent to the non-display area NA of the display panel 01. For example, the first optical component area B1 is disposed adjacent to an upper frame of the display panel 01, then a distance between the first optical component area B1 and the upper frame of the display panel 01 is relatively small. That is, a width of the first display area A1 along the second direction Y is smaller than a width of the second display area A2 along the second direction Y.

When the first bypass portion LC1 connects the first portion LL1 arranged in the first display area A1 and the second portion LL2 arranged in the second display area A2, if the width of the first display area A1 along the second direction Y is small, it is difficult to arrange many first bypass portions LC1 located on the side of the first optical component area B1 close to the upper frame of the display panel 01, then some first bypass portions LC1 electrically connected to the first portions LL1 can be located in the non-display area NA. That is, the first sections 11 of at least some of the first bypass portions LC1 are arranged in the non-display area NA at a side of the first display area A1 away from the first optical component area B1. In order to provide an earpiece in a full-screen cellphone, a groove at a middle position of the display panel needs to be provided so that the sound can come out from the speaker. However, if the first optical component area B1 and the second optical component area B2 are located at the middle position of the display panel, a width of the non-display area NA corresponding to the first optical component area B1 or the second optical component area B2 will be smaller. Therefore, it needs to reduce the number of the first bypass portions LC1, so as not to arrange too many first sections 11 in the non-display area NA and prevent the non-display area NA from exceeding the specification required by the customer. For example, the width of the first frame area B11 or the second frame area B21 can be increased, so as to arrange more second bypass portions LC2 and reduce the number of the first bypass portions LC1. Further, the number of the first bypass portions LC1 can be smaller than the number of the second bypass portions LC2.

Figure 18:
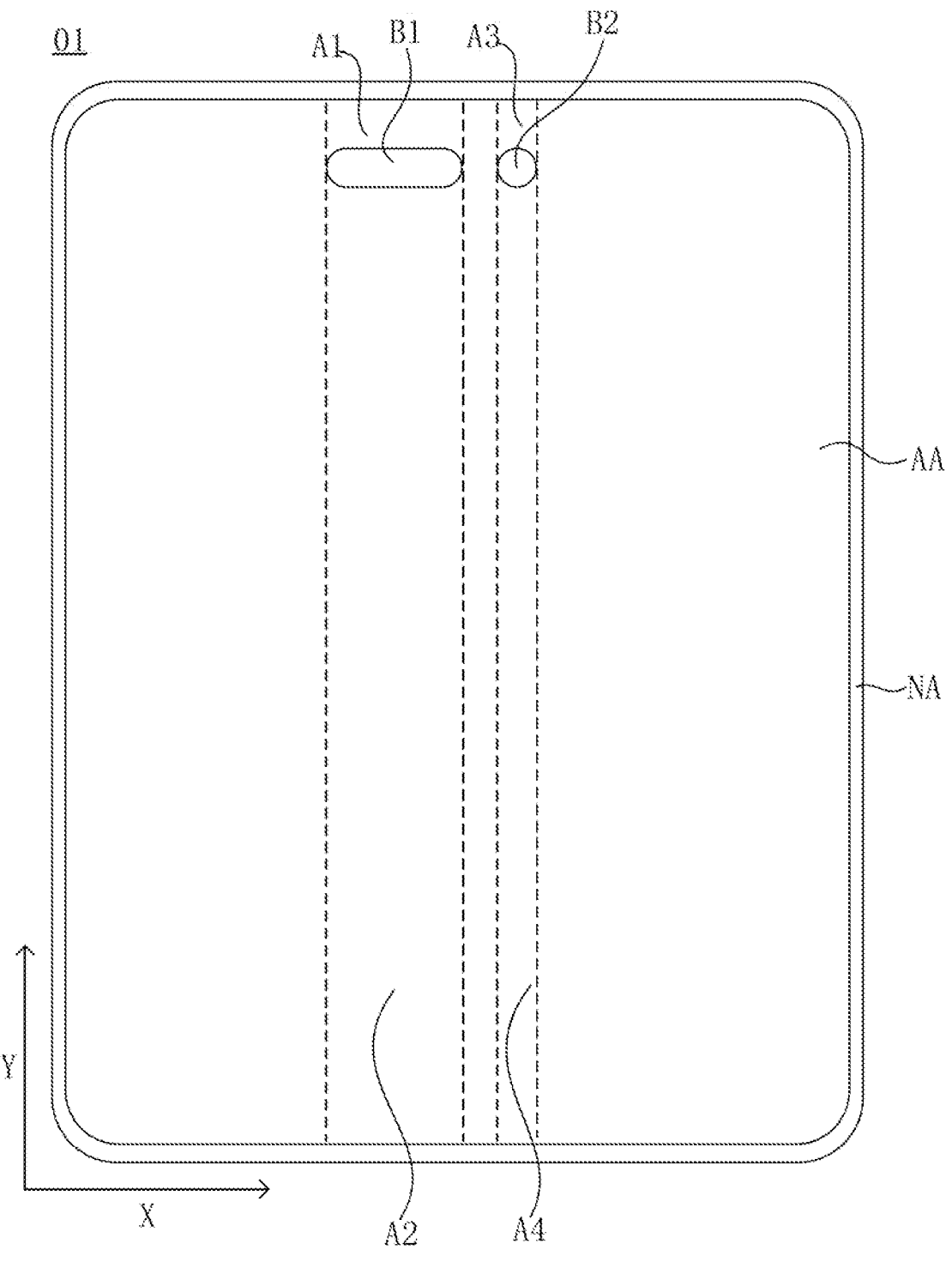
FIG. 18 is a schematic diagram of a display panel according to an embodiment of the present disclosure.

FIG. 18 is a schematic diagram of a display panel according to an embodiment of the present disclosure.

In an embodiment of the present disclosure, as shown in FIG. 18, the display panel 01 further has a second optical component area B2, which is also configured to arrange optical components. For example, the second optical component area B2 may be provided with an optical sensor, a flashlight, etc. In order to enable the optical component arranged in the second optical component area B2 to receive light from the outside or emit light to the outside, the transmittance of the second optical component area B2 to the light is greater than the transmittance of the display area AA to the light. It should be noted that the types of optical components arranged in the second optical component area B2 may be the same as or different from the types of optical components arranged in the first optical component area B1.

It should be noted that when an optical component arranged in the second optical component area B2 can emit light to the outside, this optical component in the second optical component area B2 is different from a sub-pixel in the display area AA, that is, the second optical component area B2 is not provided with a sub-pixel.

Further, in the embodiments of the present disclosure, the second optical component area B2 may be configured in various manners. For example, the second optical component area B2 is provided with a through hole or a blind hole. The through hole penetrates through the display panel 01 along a thickness direction of the display panel 01, and may be formed by cutting the display panel 01. The blind hole does not penetrate through the display panel 01 along the thickness direction of the display panel 01, and may be formed by arranging no sub-pixels in the second optical component area B2.

A width of the first optical component area B1 along the first direction X is greater than a width of the second optical component area B2 along the first direction X. Then, the number of optical components arranged in the first optical component area B1 along the first direction X may be greater than the number of optical components arranged in the second optical component area B2 along the first direction X. For example, as shown in FIG. 18, two optical components arranged are arranged in the first optical component area B1 along the first direction X, and one optical component is arranged in the second optical component area B2 along the first direction X.

Further, a width of the first optical component area B1 along the second direction Y may be the same as a width of the second optical component area B2 along the second direction Y.

The display area AA at least partially surrounds the second optical component area B2, that is, at least part of a peripheral area of the second optical component area B2 is the display area AA. For example, as shown in FIG. 18, the display area AA completely surrounds the second optical component area B2. In some cases, the display area AA may partially surround the second optical component area B2.

With further reference to FIG. 18, the display area AA includes a third display area A3 and a fourth display area A4. Along the second direction Y, the third display area A3 and the fourth display area A4 are located at two sides of the second optical component area B2, respectively. It can be understood that two areas located at two opposite sides of the second optical component area B2 in the display area AA and arranged along the second direction Y with the second optical component area B2 may be referred to as the third display area A3 and the fourth display area A4, respectively.

Figure 19:
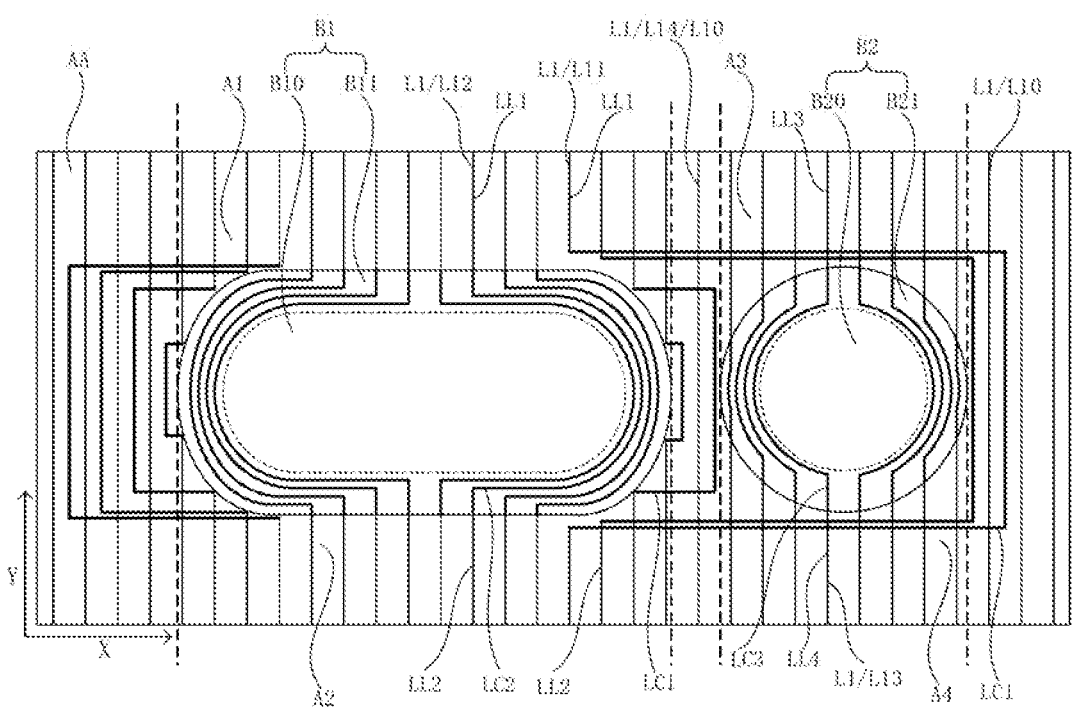
FIG. 19 is a partial schematic diagram of a display panel according to an embodiment of the present disclosure.

FIG. 19 is a partial schematic diagram of a display panel according to an embodiment of the present disclosure. It should be noted that, for the clarity of the drawings, simplified elements are illustrated in the drawings. However, it should be noted that the following embodiments are not contradictory with the previous embodiments and can be combined with the previous embodiments.

As shown in FIG. 19, the second optical component area B2 includes a second frame area B21 and a second light-transmission area B20, and the second frame area B21 surrounds the second light-transmission area B20. When the second optical component area B2 is provided with a through hole, the second light-transmission area B20 may correspond to the through hole in the second optical component area B2; and when the second optical component area B2 is provided with a blind hole, the second light-transmission area B20 may correspond to the blind hole in second optical component area B2.

As shown in FIG. 19, when the signal line extending along the first direction X in the display area AA are cut off by the second optical component area B2, a bypass-line design is required to avoid the second light-transmission area B20; and when the signal line extending along the second direction Y in the display area AA are cut off by the second optical component area B2, a bypass-line design is required to avoid the second light-transmission area B20, so that the second light-transmission area B20 has a high light transmittance.

As shown in FIG. 19, the bypass portions of some signal lines located at a periphery of the second light-transmission area B20 are arranged in the second frame area B21, then the second frame area B21 can be regarded as an area for arranging the bypass portions in the second optical component area B2. In addition, when the second light-transmission area B20 corresponds to the through hole in the second optical component area B2, the second frame area B21 can also be regarded as an encapsulation area in the second optical component area B2.

In the embodiments of the present disclosure, the first signal lines L1 further include a third-type signal line L13, and the third-type signal line L13 includes a third portion LL3, a fourth portion LL4, and a third bypass portion LC3 connecting the third portion LL3 and the fourth portion LL4. The third portion LL3 is arranged in the third display area A3, and the fourth portion LL4 is arranged in the fourth display area A4. Each of the third portion LL3 and the fourth portion LL4 may extend along the second direction Y. The third bypass portion LC3 is arranged in the second frame area B21, that is, at least a portion of the third bypass portion LC3 is arranged in the second frame area B21.

Since a width of the second optical component area B2 along the first direction X is smaller than a width of the first optical component area B1 along the first direction X, the number of the first signal lines L1 cut off by the second optical component area B2 is smaller than the number of the first signal lines L1 cut off by the first optical component area B1, so the bypass portion of the first signal line L1 corresponding to the second optical component area B2 can be arranged in the second frame area B21 of the second optical component area B2, without resulting in a too large width of the second frame area B21.

It should be noted that, a width of the second optical component area B2 along the second direction Y may be equal to a width of the first optical component area B1 along the second direction Y.

In addition, the arrangement of the third bypass portion LC3 of the third-type signal line L13 in the second frame area B21 may be the same as the arrangement of the second bypass portion LC2 of the second-type signal line in the first frame area B1. For example, two adjacent third bypass portions LC3 of the third bypass portions LC3 arranged in the second frame area B21 are located in different layers. For example, among the third bypass portions LC3 arranged in the second frame area B21, each of at least some of these third bypass portions LC3 includes a first bypass sub-portion and a second bypass sub-portion located in different layers and electrically connected to each other. The arrangement of the third bypass portion LC3 in the second frame area B21 may refer to the arrangement of the second bypass portion LC2 in the first frame area B11, which will not be repeated herein.

In some embodiments, as shown in FIG. 19, the number of the third bypass portions LC3 arranged in a part of the second frame area B21 adjacent to first optical component area B1 is equal to the number of the third bypass portions LC3 arranged in a part of the second frame area B21 away from first optical component area B1. That is, along the first direction X, for the two parts of the second frame area B21 located at two opposite sides of the second light-transmission area B20, the number of the third bypass portions LC3 arranged in the part of the second frame area B21 located at one side is the same as the number of the third bypass portions LC3 arranged in the part of the second frame area B21 located at the other side. As shown in FIG. 19, the third bypass portions LC3 in the display panel 01 are equally distributed in the two parts of the second frame area B21 located at a left side and a right side of the second light-transmission area B20.

In some embodiments, along the first direction X, an area between the first optical component area B1 and the second optical component area B2 is the display area AA. That is, the through hole or blind hole in the first optical component area B1 are not continuous with the through hole or blind hole in the second optical component area B2.

As shown in FIG. 19, in order to ensure that the sub-pixels in the display area AA between the first optical component area B1 and the second optical component area B2 can display normally, the first signal lines L1 of the display panel 01 may further include a fourth-type signal line L14, and the fourth-type signal line L14 extends along the second direction Y and is arranged in the display area AA between the first optical component area B1 and the second optical component area B2. The fourth-type signal line L13 can be regarded as the normal first signal line L10 in the display area AA arranged between the first optical component area B1 and the second optical component area B2, that is, the first signal line L1 in the display area AA between the first optical component area B1 and the second optical component area B2 is normally arranged.

In some embodiments of the present disclosure, as shown in FIG. 19, among the first bypass portions LC1 arranged at a side of the first optical component area B1 adjacent to the second optical component area B2, at least part of the first bypass portions LC1 extends to pass the display area AA between the first optical component area B1 and the second optical component area B2. In some embodiments, the third bypass portion LC3 is arranged in the second frame area B21 of the second optical component area B2, then the first bypass portion LC1 can be arranged in the display area AA between the first optical component area B1 and the second optical component area B2. That is, the display area AA between the first optical component area B1 and the second optical component area B2 is provided with the normal first signal line L10 required by the display area AA and is also provided with the first bypass portion LC1 of the portion first-type signal line L11 corresponding to the first optical component area B1.

In some embodiments of the present disclosure, as shown in FIG. 19, among the first bypass portions LC1 arranged at a side of the first optical component area B1 adjacent to the second optical component area B2, some first bypass portions LC1 extend to pass an area between the first optical component area B1 and the second optical component area B2, and some other first bypass portions LC1 extend to pass the display area AA at a side of the second optical component area B2 away from the first optical component area B1.

For example, as shown in FIG. 19, if the second optical component area B2 is arranged at a right side of the first optical component area B1, then among the first bypass portions LC1 arranged at the right side of the first optical component area B1, some first bypass portions LC1 extend to pass the display area AA between the first optical component area B1 and the second optical component area B2, and some other first bypass portions LC1 extend to pass the display area AA at a right side of the second optical component area B2.

Figure 20:
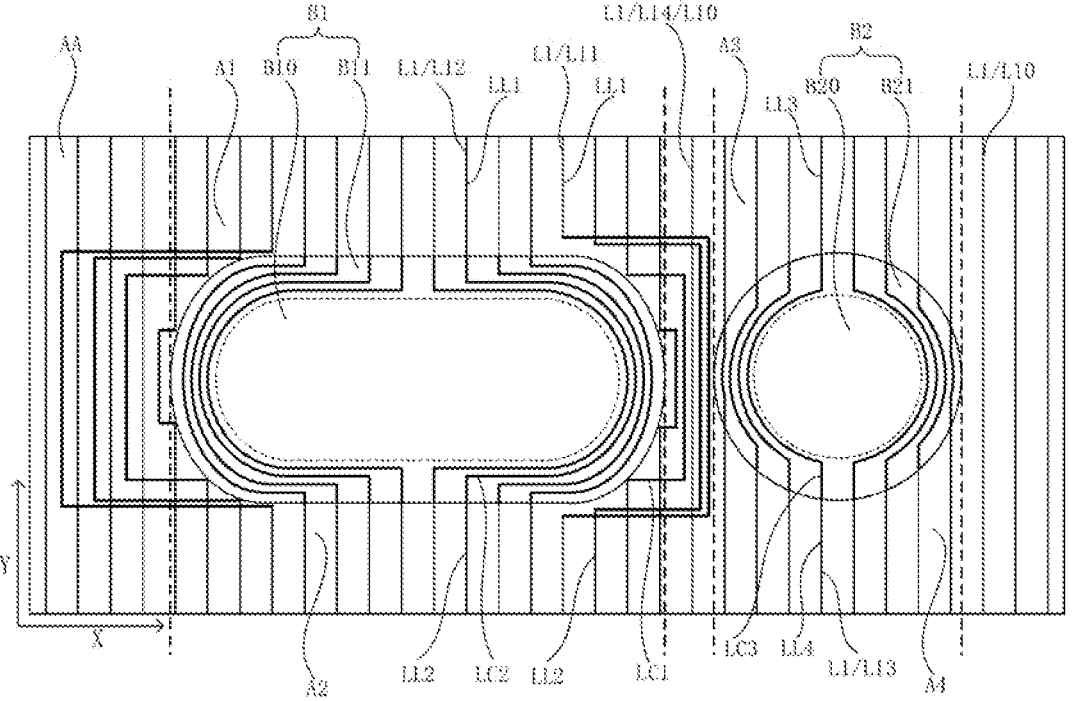
FIG. 20 is a partial schematic diagram of a display panel according to an embodiment of the present disclosure.

FIG. 20 is a partial schematic diagram of a display panel according to an embodiment of the present disclosure.

In some embodiments of the present disclosure, as shown in FIG. 20, the first bypass portions LC1 arranged at a side of the first optical component area B1 adjacent to the second optical component area B2 are all located between the first optical component area B1 and the second light-transmission area between B20. That is, the first bypass portions LC1 located at a side of the first optical component area B1 adjacent to the second optical component area B2 only extend to pass an area between the first optical component area B1 and the second light-transmission area B20, but do not extend to a side of the second optical component area B2 away from the first optical component area B1.

In an embodiment, as shown in FIG. 20, the first bypass portions LC1 arranged at a side of the first optical component area B1 adjacent to the second optical component area B2 all extend in the display area AA between the first optical component area B1 and the second optical component area B2.

Further, when a distance between the first optical component area B1 and the second optical component area B2 is small, it may cause that not all the first bypass portions LC1 can be arranged in the display area AA between the first optical component area B1 and the second optical component area B2. In this case, according to an embodiment of the present disclosure, more first bypass portions LC1 may be arranged at a side of the first optical component area B1 away from the second optical component area B2, and less first bypass portions LC1 may be arranged at a side of the first optical component area B1 adjacent to the second optical component area B2, thereby reducing the number of the first bypass portions LC1 arranged between the first optical component area B1 and the second optical component area B2, so that these first bypass portions LC1 can be reliably arranged between the two optical component areas.

Figure 21:
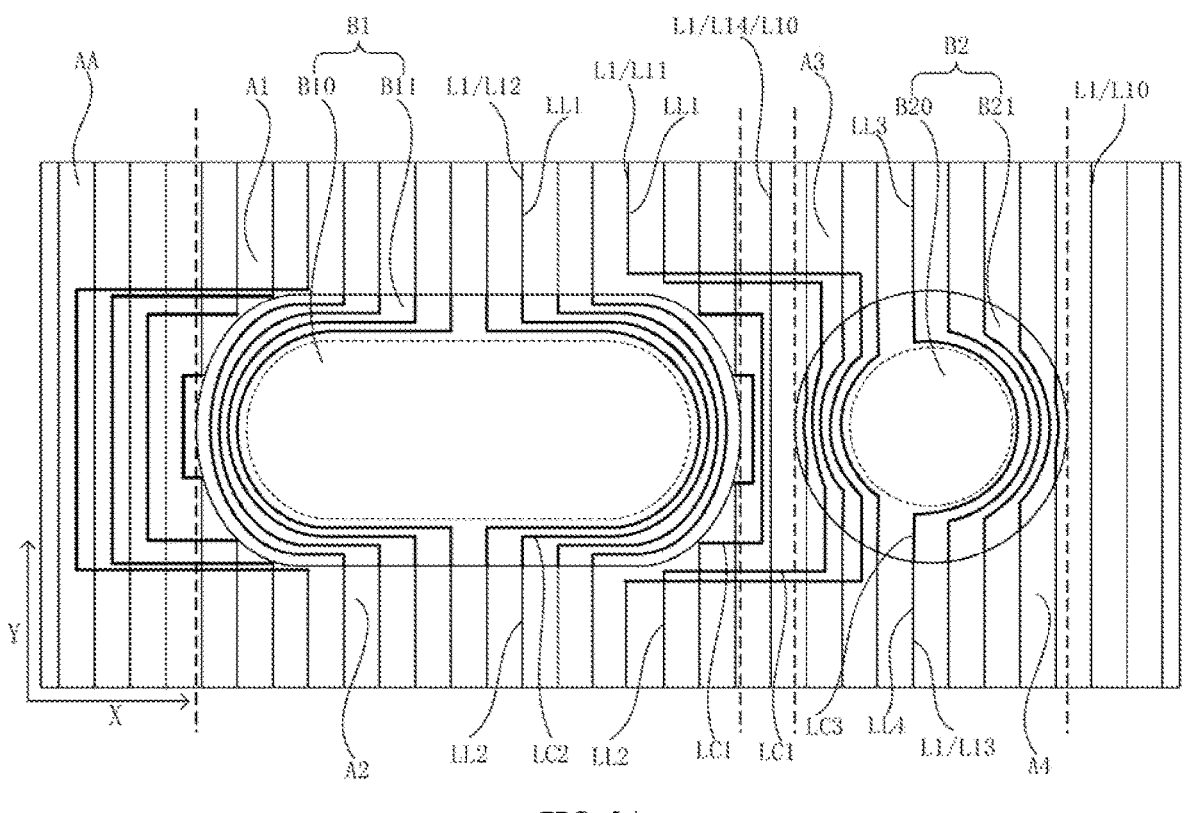
FIG. 21 is a partial schematic diagram of a display panel according to an embodiment of the present disclosure.

FIG. 21 is a partial schematic diagram of a display panel according to an embodiment of the present disclosure.

In some technical solutions corresponding to the embodiments of the present disclosure, among the first bypass portions LC1 arranged at a side of the first optical component area B1 adjacent to the second optical component area B2, some of the first bypass portions LC1 extend to pass the display area AA between the first optical component area B1 and the second optical component area B2 and pass the second frame area B21.

For example, as shown in FIG. 21, the second optical component area B2 is located at a right side of the first optical component area B1, and among the first bypass portions LC1 at the right side of the first optical component area B1, some of the first bypass portions LC1 farther from the first optical component area B1 extend not only in the display area between the first optical component area B2 and the first optical component area B1, but also in the second frame area B21 of the second optical component area B2.

In an embodiment, with further reference to FIG. 21, among the first bypass portions LC1 arranged at a side of the first optical component area B1 adjacent to the second optical component area B2, some of the first bypass portions LC1 extend to pass the display area AA between the first optical component area B1 and the second optical component area B2, and also pass the second frame area B21 at a side of the second optical component area B2 adjacent to the first optical component area B1.

For example, as shown in FIG. 21, the second optical component area B2 is located at a right side of the first optical component area B1, and among the first bypass portions LC1 at the right side of the first optical component area B1, some of the first bypass portions LC1 farther from the first optical component area B1 extend in the second frame area B21 at a left side of the second optical component area B2.

In this case, all of the first bypass portions LC1 arranged at a side of the first optical component area B1 adjacent to the second optical component area B2 can be arranged between the first optical component area B1 and the second light-transmission area B20.

In order to ensure that the second frame area B21 has a same width when some of the first bypass portions LC1 are arranged in the second frame area B21 at a side of the second optical component area B2 adjacent to the first optical component area B1, the number of the third bypass portions LC3 arranged in the second frame area B21 adjacent to the first optical component area B1 is smaller than the number of the third bypass portions LC3 arranged in the second frame area B21 away from the first optical component area B1, so that a space is reserved in the second frame area B21 adjacent to the first optical component area B1 for arranging the first bypass portion LC1.

Further, when the second frame area B21 is provided with the first bypass portion LC1 and the third bypass portion LC3, the first bypass portions LC1 and the third bypass portions LC3 arranged in the second frame area B21 are equally distributed in two parts of the second frame area B21 at two opposite sides of the light-transmission area B20. As shown in FIG. 21, two first bypass portions LC1 and three third bypass portions LC3 are provided in the second frame area B21 at a left side of the second light-transmission area B20, and five third bypass portions LC3 are arranged in the second frame area B21 at a right side of the second light-transmission area B20. That is, the number of bypass portions of the first signal lines L1 arranged in the second frame area B21 at a left side of the second light-transmission area B20 is equal to the number of bypass portions of the first signal lines L1 arranged in the second frame area B21 at a right side of the second light-transmission area B20.

In an embodiment, a width of the second frame area B21 of the second optical component area B2 may be greater than a width of the first frame area B11 of the first optical component area B2.

Figure 22:
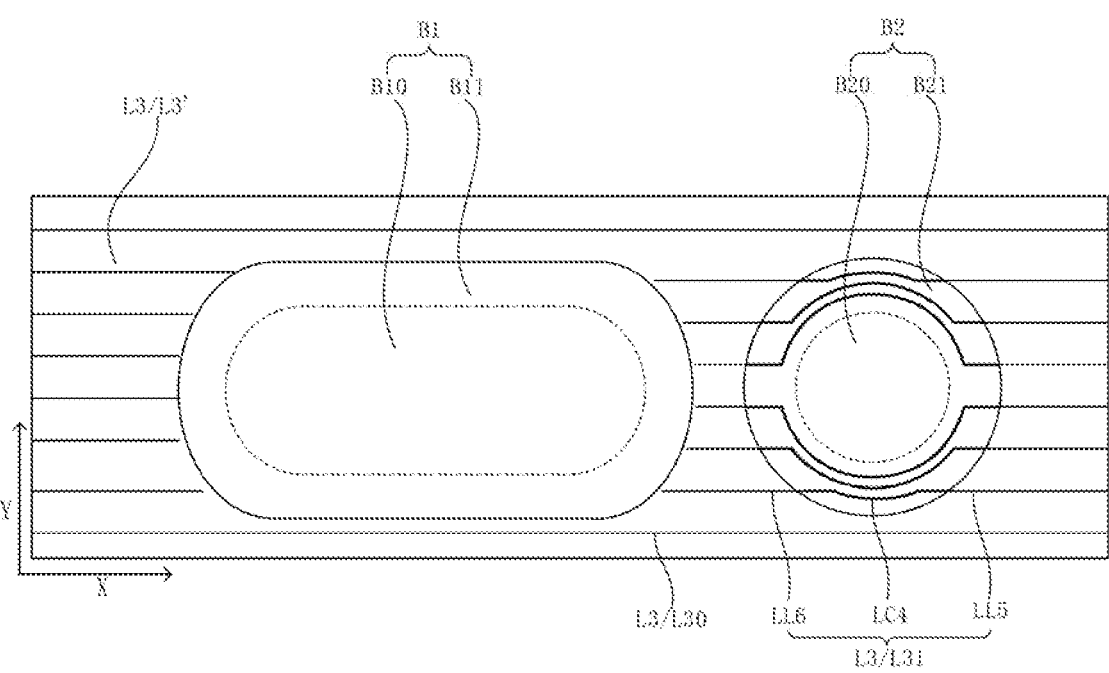
FIG. 22 is a partial schematic diagram of a display panel according to an embodiment of the present disclosure.

FIG. 22 is a partial schematic diagram of a display panel according to an embodiment of the present disclosure.

In some embodiments, as shown in FIG. 22, the display panel 01 further includes third signal lines L3, and some of the third signal lines L3 (the third signal line L31 in FIG. 22) each include a fifth portion LL5 and a sixth portion LL6. The fifth portion LL5 extends along the first direction X and is arranged in the display area AA at a side of the second optical component area B2 away from the first optical component area B1, and the sixth portion LL6 extends along the first direction X and is arranged in the display area AA between the first optical component area B1 and the second optical component area B2.

In addition, the third signal line L31 including the fifth portion LL5 and the sixth portion LL6 further includes a fourth bypass portion LC4, which is configured to connect the fifth portion LL5 and the sixth portion LL6, and the fourth bypass portion LC4 is arranged in the second frame area B21 of the second optical component area B2.

The third signal line L3 may be a control signal line, which refers to a signal line that is electrically connected to the control electrodes of some transistors in the pixel circuit DC.

In an embodiment, the third signal line L31 is a signal line extending along the second direction Y and cut off by the second optical component area B2, and the third signal line L31 bypasses the second optical component area B2 through a bypass portion in the second frame area B21. Therefore, the third signal line L31 does not occupy the second light-transmission area B20, thereby ensuring the light transmittance of the second light-transmission area B20. Moreover, a part of the third signal lines L31 is arranged in the display area AA at a side of the second optical component area B2 away from the first optical component area B1, and another part of the third signal lines L31 is arranged in the display area AA between the second optical component area B2 and the first optical component area B1. Therefore, the third signal lines L31 can provide a control signal to both the pixel circuit DC at a side of the second optical component area B2 away from the first optical component area B1 and the pixel circuit DC between the second optical component area B2 and the first optical component area B1.

It should be noted that some third signal lines L3 among the third signal lines L3 extend along the first direction X and do not pass the first optical component area B1 and the second optical component area B2, and these some third signal lines L3 are referred to as the third signal lines L30.

In some embodiments of the present disclosure, as shown in FIG. 22, a part of the third signal lines L3 (the third signal lines L3' in FIG. 22) extends along the first direction X and is arranged in the display area AA at a side of the first optical component area B1 away from the second optical component area B2. That is, for the third signal lines within a range of a width of the first optical component area B1 and the second optical component area B2 along the second direction Y, the third signal line L3' at a side of the first optical component area B1 away from the second optical component area B2 terminates before the second optical component area B2. Then, the control signal of the pixel circuit DC between the first optical component area B1 and the second optical component area B2 is supplied by the third signal line L31, rather than the third signal line L3'.

Figure 23:
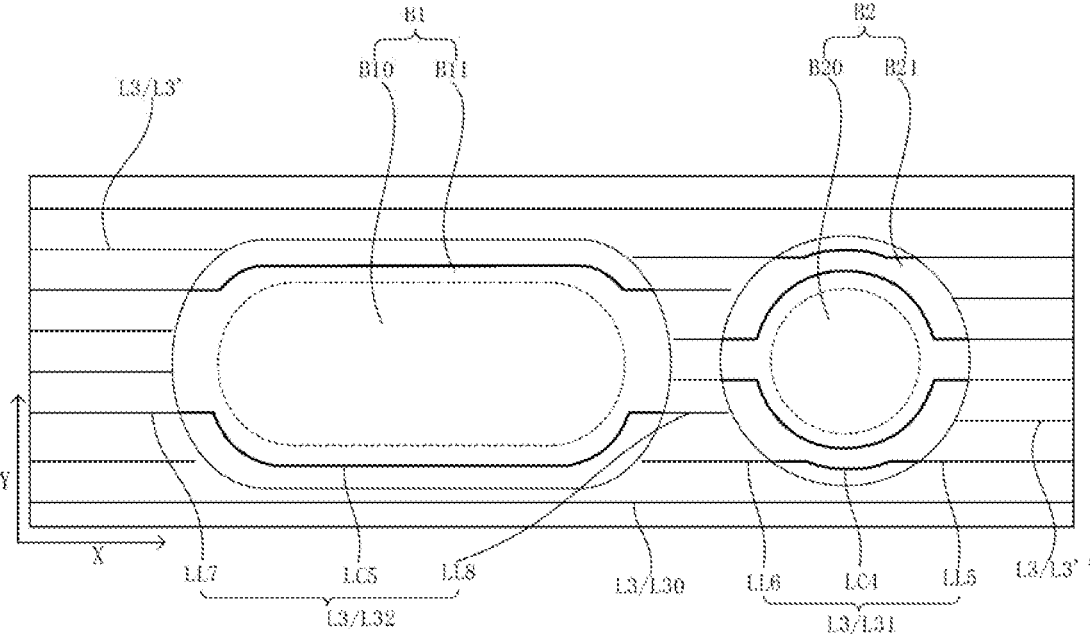
FIG. 23 is a partial schematic diagram of a display panel according to an embodiment of the present disclosure.

FIG. 23 is a partial schematic diagram of a display panel according to an embodiment of the present disclosure.

In some embodiments of the present disclosure, as shown in FIG. 23, some of the third signal lines L3 (the third signal lines L32 in FIG. 23) each include a seventh portion LL7 and an eighth portion LL8. The seventh portion LL7 extends along the first direction X and is arranged in the display area AA at a side of the first optical component area B1 away from the second optical component area B2. The eighth portion LL8 extends along the first direction X and is arranged in the display area AA between the first optical component area B1 and the second optical component area B2.

In addition, the third signal line L32 including the seventh portion LL7 and the eighth portion LL8 further includes a fifth bypass portion LC5 for connecting the seventh portion LL7 and the eighth portion LL8, and the fifth bypass portion LC5 is arranged in the first frame area B11 of the first optical component area B1.

In an embodiment, the third signal lines providing the control signal to the pixel circuits between the first optical component area B1 and the second optical component area B2 include the third signal line L31 and the third signal line L32.

Among the third scanning lines L3 that provide control signals to all pixel circuits DC between the first optical component area B1 and the second optical component area B2, some third scanning lines L3 reach the display area AA between the first optical component area B1 and the second optical component area B2 though the bypass portions in the first frame area B11 of the first optical component area B1, and some other third scanning lines L3 reach the display area AA between the first optical component area B1 and the second optical component area B2 though the bypass portions in the second frame area B21 of the second optical component area B1. In this way, the bypass portions of the third scanning lines L3 include bypass portions in the first frame area B11 and bypass portions in the second frame area B21, thereby being beneficial to a narrow frame of the first frame area B11 and a narrow frame of the second frame area B21.

In addition, some third signal lines L3' each extend along the first direction X and are arranged in the display area AA at a side of the first optical component area B1 away from the second optical component area B2, and some other third signal lines L3" each extend along the first direction X and are arranged in the display area AA at a side of the first optical component area B1 away from the second optical component area B2. One third signal line L3' and one third signal line L31 in a same row can provide a same control signal to the pixel circuits in a same row, and one third signal line L3" and one third signal line L32 in a same row can provide a same control signal to the pixel circuits in a same row.

It should be noted that according to the embodiments shown in FIG. 11 and FIG. 12, the third signal line L3 described above refers to the second scanning signal line SP. For other scanning signal line, since a single-side drive manner is adopted in the embodiments of the present disclosure, a bypass design needs to be provided in each of the first frame area B11 and the second frame area B12. In the embodiments described above, a total number of the bypass portions of the scanning signal lines can be reduced, thereby avoiding that a width of each of the first frame area and the second frame area exceeds the specifications required by customers.

Figure 24:
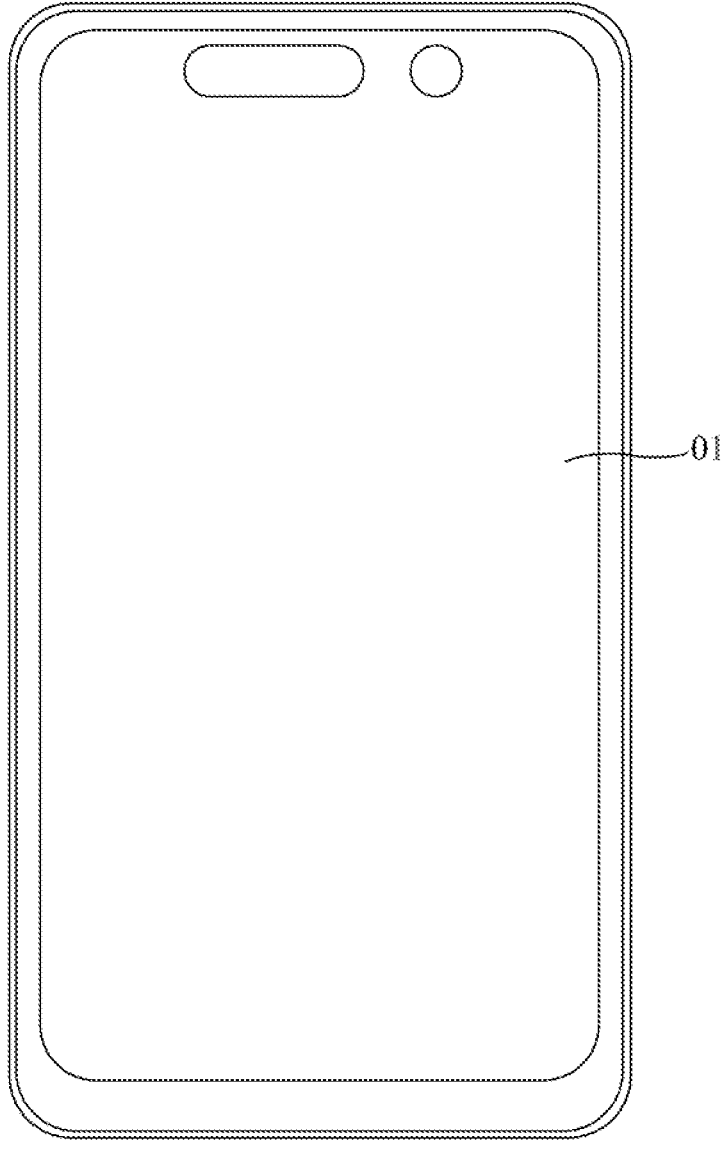
FIG. 24 is a schematic diagram of a display device according to an embodiment of the present disclosure.

FIG. 24 is a schematic diagram of a display device according to an embodiment of the present disclosure.

As shown in FIG. 24, an embodiment of the present disclosure further provides a display device, including the display panel 01 provided by any one of the foregoing embodiments. Exemplarily, the display device may be an electronic device such as a mobile phone, a computer, a smart wearable device (for example, a smart watch), and a vehicle-mounted display device, which will not be limited in the embodiments of the present disclosure.

For the display device provided by the embodiments of the present disclosure, some of the bypass portions of the first signal lines L1 corresponding to the first optical component area B1 are arranged in the display area AA, so these bypass portions can avoid the first frame area B11 of the first optical component area B1, thereby avoiding that the bypass portions of too many first signal lines L1 are arranged in the first frame area B11. In this way, the first frame area B11 has a small width, so that the display panel 01 has a better visual effect. In addition, some of the bypass portions of the first signal lines L1 corresponding to the first optical component area B1 are arranged in the first frame area B11, so these bypass portions do not need to be arranged in the display area AA, thereby avoiding that the bypass portions of too many first signal lines L1 are arranged in the display area AA and have larger lengths. In this way, the first signal lines L1 corresponding to the first optical component area B1 do not have too large loads, so that the signals transmitted by different first signal lines L1 are consistent in transmission loss, thereby achieving display uniformity of the display device.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:

a first optical component area having a first width along a first direction greater than a second width along a second direction, wherein the first direction is perpendicular to the second direction, the first optical component area comprising a first frame area and a first light-transmission area, wherein the first frame area surrounds the first light-transmission area;

a display area at least partially surrounding the first optical component area, wherein the display area comprises a first display area and a second display area located on two sides of the first optical component area along the second direction; and a plurality of first signal lines comprising first-type signal lines and second-type signal lines, wherein each of the first-type signal lines comprises: a first portion, a second portion, and a first bypass portion connecting the first portion and the second portion, wherein the first portion is arranged in the first display area, the second portion is arranged in the second display area, and the first bypass portion is arranged in the display area;

wherein each of the second-type signal lines comprises: a first portion, a second portion, and a second bypass portion connecting the first portion and the second portion, wherein the first portion is arranged in the first display area, the second portion is arranged in the second display area, and the second bypass portion is arranged in the first frame area, wherein the display panel further comprises a second optical component area, wherein the second optical component area comprises a second frame area and a second light-transmission area, the second frame area surrounding the second light-transmission area, and a width of the first optical component area along the first direction being greater than a width of the second optical component area along the first direction, wherein the display area at least partially surrounds the second optical component area and further comprises a third display area and a fourth display area; and wherein along the second direction, the third display area and the fourth display area are located at two sides of the second optical component area;

wherein the plurality of first signal lines further comprises a third-type signal line comprising a third portion, a fourth portion, and a third bypass portion connecting the third portion and the fourth portion; and wherein the third portion is arranged in the third display area and the fourth portion is arranged in the fourth display area; and wherein the third bypass portion is arranged in the second frame area.

2. The display panel according to claim 1, wherein the second bypass portions arranged in the first frame area comprise two adjacent second bypass portions along the first direction that are located in different layers; or wherein the second bypass portions arranged in the first frame area comprise at least one second bypass portion each comprising a first bypass sub-portion and a second bypass sub-portion that are arranged in different layers and electrically connected to each other.

3. The display panel according to claim 1, wherein the first light-transmission area comprises a first side and a second side opposite to each other along the first direction, and the first frame area comprises a first part located at the first side of the first light-transmission area and a second part located at the second side of the first light-transmission area; and wherein a number of the second bypass portions in the first part of the first frame area is equal to a number of the second bypass portions in the second part of the first frame area.

4. The display panel according to claim 1, further comprising:

a plurality of dummy first signal lines arranged in the display area;

a non-display area surrounding the display area;

a second signal line arranged in the display area; and a fixed potential line arranged in the non-display area, wherein the plurality of dummy first signal lines each extends along the second direction, and is arranged in a different layer from at least one of the first portion of one of the first-type signal lines or the second portion of one of the first-type signal lines;

wherein the first bypass portion of each first-type signal line comprises a first section, a second section and a third section; and the first section connects the first portion of one of the first-type signal lines and one dummy first signal line of the plurality of dummy first signal lines, and the second section connects the second portion of one of the first-type signal lines and the one dummy first signal line of the plurality of dummy first signal lines; and wherein the fixed potential line is electrically connected to the second signal line through one or more of the plurality of dummy first signal lines.

5. The display panel according to claim 1, wherein the first optical component area comprises two opposite sides along the first direction, and a number of the first bypass portions arranged in the display area at one of the two opposite sides of the first optical component area is equal to a number of the first bypass portions arranged in the display area at the other one of the two opposite sides of the first optical component area.

6. The display panel according to claim 1, wherein in the first display area, along the first direction, the first portions of the first-type signal lines are arranged between the first portions of the second-type signal lines; or, wherein in the second display area, along the first direction, the second portions of the first-type signal lines are arranged between the second portions of the second-type signal lines; or wherein in the first display area, along the first direction, the first portions of the second-type signal lines are arranged between the first portions of the first-type signal lines; or, wherein in the second display area, along the first direction, the second portions of the second-type signal lines are arranged between the second portions of the first-type signal lines.

7. The display panel according to claim 1, wherein in the first display area, along the first direction, the first portions of the first-type signal lines are alternately arranged with the first portions of the second-type signal lines; or, wherein in the second display area, along the first direction, the second portions of the first-type signal lines are alternately arranged with the second portions of the second-type signal lines.

8. The display panel according to claim 1, wherein among the first bypass portions arranged at a side of the first optical component area adjacent to the second optical component area, at least one first bypass portion extends to pass the display area between the first optical component area and the second optical component area.

9. The display panel according to claim 8, wherein among the first bypass portions arranged at the side of the first optical component area adjacent to the second optical component area, at least one first bypass portion extends to pass an area between the first optical component area and the second optical component area, and at least one first bypass portion extends to pass the display area located at a side of the second optical component area away from the first optical component area.

10. The display panel according to claim 8, wherein among the first bypass portions arranged at the side of the first optical component area adjacent to the second optical component area, at least one first bypass portion extends to pass the display area between the first optical component area and the second optical component area, and further pass the second frame area.

11. The display panel according to claim 10, wherein among the first bypass portions arranged at the side of the first optical component area adjacent to the second optical component area, at least one first bypass portion extends to pass the display area between the first optical component area and the second optical component area, and further pass the second frame area located at a side of the second optical component area adjacent to the first optical component area.

12. The display panel according to claim 11, wherein a number of the third bypass portions arranged in the second frame area adjacent to the first optical component area is smaller than a number of the third bypass portions arranged in the second frame area away from the first optical component area.

13. The display panel according to claim 12, wherein all of the first bypass portions arranged at the side of the first optical component area adjacent to the second optical component area are located between the first optical component area and the second light-transmission area.

14. The display panel according to claim 1, wherein a number of the third bypass portions arranged in the second frame area adjacent to the first optical component area is equal to a number of the third bypass portions arranged in the second frame area away from the first optical component area.

15. The display panel according to claim 1, wherein the plurality of first signal lines further comprises a fourth-type signal line, and the fourth-type signal line extends along the second direction; and wherein the fourth-type signal line is arranged in the display area between the first optical component area and the second optical component area.

16. The display panel according to claim 1, further comprising: a plurality of third signal lines, wherein at least one of the plurality of third signal lines each comprises a fifth portion, a sixth portion and a fourth bypass portion connecting the fifth portion and the sixth portion;

wherein the fifth portion extends along the first direction and is arranged in the display area at a side of the second optical component area away from the first optical component area;

wherein the sixth portion extends along the first direction and is arranged in the display area between the first optical component area and the second optical component area; and wherein the fourth bypass portion is arranged in the second frame area of the second optical component area.

17. The display panel of claim 16, wherein at least one of the plurality of third signal lines each comprises a seventh portion, an eighth portion, and a fifth bypass portion connecting the seventh portion and the eighth portion;

wherein the seventh portion extends along the first direction and is arranged in the display area at a side of the first optical component area away from the second optical component area;

wherein the eighth portion extends along the first direction and is arranged in the display area between the first optical component area and the second optical component area; and wherein the fifth bypass portion is arranged in the first frame area of the first optical component area.

18. The display panel according to claim 16, wherein at least one of the plurality of third signal lines each extends along the first direction and is arranged in the display area at a side of the first optical component area away from the second optical component area.

19. A display device, comprising a display panel, wherein the display panel comprises:

a first optical component area having a first width along a first direction greater than a second width along a second direction, the first direction being perpendicular to the second direction, the first optical component area comprising a first frame area and a first light-transmission area, and the first frame area surrounding the first light-transmission area;

a display area at least partially surrounding the first optical component area and comprising a first display area and a second display area that are located at two sides of the first optical component area along the second direction; and a plurality of first signal lines, wherein the plurality of first signal lines comprises first-type signal lines and second-type signal lines, wherein the first-type signal lines and the second-type signal lines each comprise a first portion and a second portion, wherein the first portion is arranged in the first display area and the second portion is arranged in the second display area, wherein the first-type signal lines each further comprise a first bypass portion connecting the first portion and the second portion, and the second-type signal lines each further comprise a second bypass portion connecting the first portion and the second portion, wherein the first bypass portion is arranged in the display area, and the second bypass portion is arranged in the first frame area, wherein the display panel further comprises a second optical component area, wherein the second optical component area comprises a second frame area and a second light-transmission area, the second frame area surrounding the second light-transmission area, and a width of the first optical component area along the first direction being greater than a width of the second optical component area along the first direction, wherein the display area at least partially surrounds the second optical component area and further comprises a third display area and a fourth display area; and wherein along the second direction, the third display area and the fourth display area are located at two sides of the second optical component area;

wherein the plurality of first signal lines further comprises a third-type signal line comprising a third portion, a fourth portion, and a third bypass portion connecting the third portion and the fourth portion; and wherein the third portion is arranged in the third display area and the fourth portion is arranged in the fourth display area; and wherein the third bypass portion is arranged in the second frame area.

* * * * *